US011139232B2

(12) United States Patent
Huang

(10) Patent No.: US 11,139,232 B2
(45) Date of Patent: Oct. 5, 2021

(54) WIRING STRUCTURE AND METHOD FOR MANUFACTURING THE SAME

(71) Applicant: Advanced Semiconductor Engineering, Inc., Kaohsiung (TW)

(72) Inventor: Wen Hung Huang, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 27 days.

(21) Appl. No.: 16/812,235

(22) Filed: Mar. 6, 2020

(65) Prior Publication Data

US 2021/0280505 A1 Sep. 9, 2021

(51) Int. Cl.

| | |
|---|---|
| ***H01L 23/498*** | (2006.01) |
| ***H01L 23/00*** | (2006.01) |
| ***H01L 21/48*** | (2006.01) |

(52) U.S. Cl.

CPC .... *H01L 23/49838* (2013.01); *H01L 21/4857* (2013.01); *H01L 23/49822* (2013.01); *H01L 24/16* (2013.01); *H01L 2224/16227* (2013.01)

(58) Field of Classification Search

CPC ........... H01L 23/49838; H01L 21/4857; H01L 23/49822; H01L 24/16; H01L 2224/16227

See application file for complete search history.

(56) References Cited

U.S. PATENT DOCUMENTS

| | | | | |
|---|---|---|---|---|
| 2019/0103346 A1* | 4/2019 | Goh | .................. | H01L 23/49827 |
| 2019/0244885 A1* | 8/2019 | Kim | .................. | H01L 23/49838 |
| 2020/0051883 A1* | 2/2020 | Huang | ............. | H01L 21/02422 |

* cited by examiner

*Primary Examiner* — Douglas W Owens

(74) *Attorney, Agent, or Firm* — Foley & Lardner LLP

(57) ABSTRACT

A wiring structure and a method for manufacturing a wiring structure are provided. The wiring structure includes a first conductive structure, a second conductive structure, a dent structure and an adhesion layer. The first conductive structure includes at least one dielectric layer and at least one circuit layer in contact with the dielectric layer. The second conductive structure includes at least one dielectric layer and at least one circuit layer in contact with the dielectric layer. The dent structure is attached to the first conductive structure. The adhesion layer is interposed between the first conductive structure and the second conductive structure to bond the first conductive structure and the second conductive structure together. A periphery portion of the adhesion layer is disposed in a gap between the dent structure and the second conductive structure.

20 Claims, 30 Drawing Sheets

WIRING STRUCTURE AND METHOD FOR MANUFACTURING THE SAME

BACKGROUND

1. Field of the Disclosure

The present disclosure relates to a wiring structure, and a manufacturing method, and to a wiring structure including at least two conductive structures bonded together by an adhesion layer, and a method for manufacturing the same.

2. Description of the Related Art

Along with the rapid development in electronics industry and the progress of semiconductor processing technologies, semiconductor chips are integrated with an increasing number of electronic components to achieve improved electrical performance and additional functions. Accordingly, the semiconductor chips are provided with more input/output (I/O) connections. To manufacture semiconductor packages including semiconductor chips with an increased number of I/O connections, circuit layers of semiconductor substrates used for carrying the semiconductor chips may correspondingly increase in size. Thus, a thickness and a warpage of a semiconductor substrate may correspondingly increase, and a yield of the semiconductor substrate may decrease.

SUMMARY

In some embodiments, a wiring structure includes a first conductive structure, a second conductive structure, a dent structure and an adhesion layer. The first conductive structure includes at least one dielectric layer and at least one circuit layer in contact with the dielectric layer. The second conductive structure includes at least one dielectric layer and at least one circuit layer in contact with the dielectric layer. The dent structure is attached to the first conductive structure. The adhesion layer is interposed between the first conductive structure and the second conductive structure to bond the first conductive structure and the second conductive structure together. A periphery portion of the adhesion layer is disposed in a gap between the dent structure and the second conductive structure.

In some embodiments, a wiring structure includes a first stacked structure, a second stacked structure, a dent structure and an adhesion layer. The first stacked structure includes at least one dielectric layer and at least one circuit layer in contact with the dielectric layer. The second stacked structure includes at least one dielectric layer and at least one circuit layer in contact with the dielectric layer. A width of the second stacked structure is less than a width of the first stacked structure. The dent structure is attached to the first stacked structure, and defines a central cavity. The adhesion layer is disposed in the central cavity. The second conductive structure is attached to the adhesion layer in the central cavity of the dent structure.

In some embodiments, a method for manufacturing a wiring structure includes: (a) providing a first conductive structure including at least one dielectric layer and at least one circuit layer in contact with the dielectric layer; (b) forming a dent structure on the first conductive structure to define a central cavity; (c) disposing an adhesion layer in the central cavity; (d) providing a second conductive structure including at least one dielectric layer and at least one circuit layer in contact with the dielectric layer; and (e) attaching the second conductive structure to the first conductive structure through the adhesion layer.

BRIEF DESCRIPTION OF THE DRAWINGS

Aspects of some embodiments of the present disclosure are readily understood from the following detailed description when read with the accompanying figures. It is noted that various structures may not be drawn to scale, and dimensions of the various structures may be arbitrarily increased or reduced for clarity of discussion.

FIG. 3I illustrates one or more stages of an example of a method for manufacturing a wiring structure according to some embodiments of the present disclosure.

DETAILED DESCRIPTION

Figure 1:
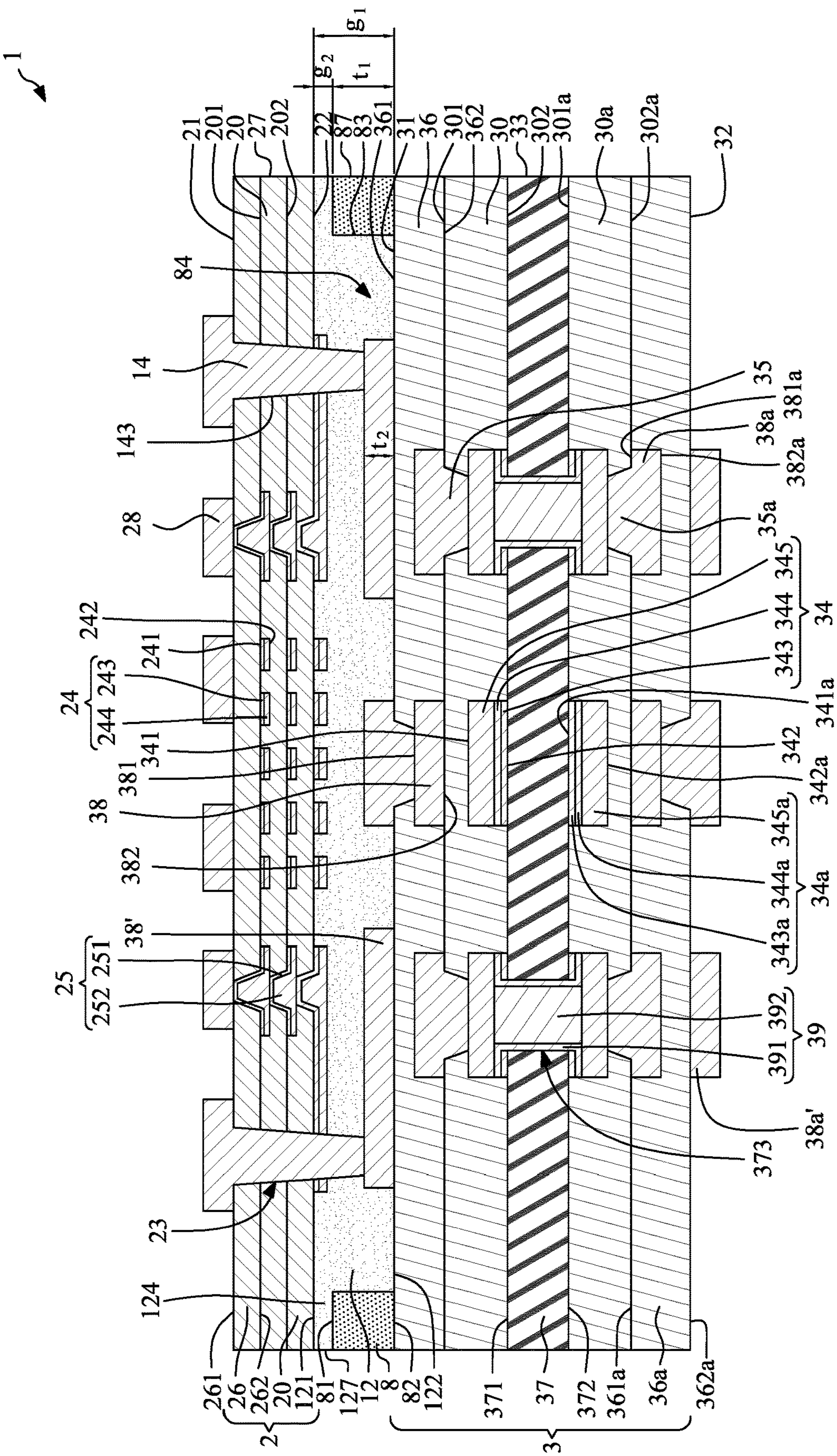
FIG. 1 illustrates a cross-sectional view of a wiring structure according to some embodiments of the present disclosure.

Common reference numerals are used throughout the drawings and the detailed description to indicate the same or similar components. Embodiments of the present disclosure will be readily understood from the following detailed description taken in conjunction with the accompanying drawings.

The following disclosure provides many different embodiments, or examples, for implementing different features of the provided subject matter. Specific examples of components and arrangements are described below to explain certain aspects of the present disclosure. These are, of course, merely examples and are not intended to be limiting. For example, the formation of a first feature over or on a second feature in the description that follows may include embodiments in which the first and second features are formed or disposed in direct contact, and may also include embodiments in which additional features may be formed or disposed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

To meet the specification of increasing I/O counts, a number of dielectric layers of a substrate should increase. In some comparative embodiments, a manufacturing process of a core substrate may include the following stages. Firstly, a core with two copper foils disposed on two sides thereof is provided. Then, a plurality of dielectric layers and a plurality of circuit layers are formed or stacked on the two copper foils. One circuit layer may be embedded in one corresponding dielectric layer. Therefore, the core substrate may include a plurality of stacked dielectric layers and a plurality of circuit layers embedded in the dielectric layers on both sides of the core. Since a line width/line space (L/S) of the circuit layers of such core substrate may be greater than or equal to 10 micrometers (μm)/10 μm, the number of the dielectric layers of such core substrate is relatively large. Although the manufacturing cost of such core substrate is low, the manufacturing yield for the circuit layers and the dielectric layers of such core substrate is also low, and, thus, the yield of such core substrate is low. In addition, each dielectric layer is relatively thick, and, thus, such core substrate is relatively thick. In some comparative embodiments, if a package has 10000 I/O counts, such core substrate may include twelve layers of circuit layers and dielectric layers. The manufacturing yield for one layer (including one circuit layer and one dielectric layer) of such core substrate may be 90%. Thus, the yield of such core substrate may be $(0.9)^{12}=28.24\%$. In addition, warpage of the twelve layers of circuit layers and dielectric layers may be accumulated, and, thus, the top several layers may have severe warpage. As a result, the yield of such core substrate may be further reduced.

To address the above concerns, in some comparative embodiments, a coreless substrate is provided. The coreless substrate may include a plurality of dielectric layers and a plurality of fan-out circuit layers. In some embodiments, a manufacturing process of a coreless substrate may include the following stages. Firstly, a carrier is provided. Then, a plurality of dielectric layers and a plurality of fan-out circuit layers are formed or stacked on a surface of the carrier. One fan-out circuit layer may be embedded in one corresponding dielectric layer. Then, the carrier is removed. Therefore, the coreless substrate may include a plurality of stacked dielectric layers and a plurality of fan-out circuit layers embedded in the dielectric layers. Since a line width/line space (L/S) of the fan-out circuit layers of such coreless substrate may be less than or equal to 2 μm/2 μm, the number of the dielectric layers of such coreless substrate can be reduced. Further, the manufacturing yield for the fan-out circuit layers and the dielectric layers of such coreless substrate is high. For example, the manufacturing yield for one layer (including one fan-out circuit layer and one dielectric layer) of such coreless substrate may be 99%. However, the manufacturing cost of such coreless substrate is relatively high.

At least some embodiments of the present disclosure provide for a wiring structure which has an advantageous compromise of yield and manufacturing cost. In some embodiments, the wiring structure includes an upper conductive structure and a lower conductive structure bonded together by an adhesion layer. At least some embodiments of the present disclosure further provide for techniques for manufacturing the wiring structure.

FIG. 1 illustrates a cross-sectional view of a wiring structure 1 according to some embodiments of the present disclosure. The wiring structure 1 includes an upper conductive structure 2, a lower conductive structure 3, a dent structure 8, an adhesion layer 12 and at least one conductive via 14.

The upper conductive structure 2 includes at least one dielectric layer (including, for example, two first dielectric layers 20 and a second dielectric layer 26) and at least one circuit layer (including, for example, three first circuit layers 24 and a second circuit layer 28 formed of a metal, a metal alloy, or other conductive material) in contact with the dielectric layer (e.g., the first dielectric layers 20 and the second dielectric layer 26). In some embodiments, the upper conductive structure 2 may be similar to a coreless substrate, and may be in a wafer type, a panel type or a strip type. The upper conductive structure 2 may be also referred to as "a stacked structure" or "a high-density conductive structure" or "a high-density stacked structure". The circuit layer (including, for example, the three circuit layers 24) of the upper conductive structure 2 may be also referred to as "a high-density circuit layer". In some embodiments, a density of a circuit line (including, for example, a trace or a pad) of the high-density circuit layer is greater than a density of a circuit line of a low-density circuit layer. That is, the count of the circuit line (including, for example, a trace or a pad) in a unit area of the high-density circuit layer is greater than the count of the circuit line in an equal unit area of the low-density circuit layer, such as about 1.2 times or greater, about 1.5 times or greater, or about 2 times or greater. Alternatively, or in combination, a line width/line space (L/S) of the high-density circuit layer is less than a L/S of the low-density circuit layer, such as about 90% or less, about 50% or less, or about 20% or less. Further, the conductive structure that includes the high-density circuit layer may be designated as the "high-density conductive structure", and the conductive structure that includes the low-density circuit layer may be designated as a "low-density conductive structure".

In some embodiments, the upper conductive structure 2 may be formed by bumping process, and may be designated as a "bumping level conductive structure". The lower conductive structure 3 may be formed by substrate process, and may be designated as a "substrate level conductive structure". The upper conductive structure 2 and the lower conductive structure 3 may be formed by different processes.

The upper conductive structure 2 has a top surface 21 and a bottom surface 22 opposite to the top surface 21, and defines at least one through hole 23, each of which is a single, continuous through hole. The upper conductive structure 2 includes a plurality of dielectric layers (e.g., the two first dielectric layers 20 and the second dielectric layer 26), a plurality of circuit layers (e.g., the three first circuit layers 24 and the second circuit layer 28) and at least one inner via 25. The dielectric layers (e.g., the first dielectric layers 20 and the second dielectric layer 26) are stacked on one another. For example, the second dielectric layer 26 is disposed on the first dielectric layers 20, and, thus, the second dielectric layer 26 is the topmost dielectric layer. In some embodiments, a material of the dielectric layers (e.g., the first dielectric layers 20 and the second dielectric layer 26) is transparent, and can be seen through by human eyes or machine. That is, a mark disposed adjacent to the bottom surface 22 of the upper conductive structure 2 can be recognized or detected from the top surface 21 of the upper conductive structure 2 by human eyes or machine. In some embodiments, a transparent material of the dielectric layers has a light transmission for a wavelength in the visible range (or other pertinent wavelength for detection of a mark) of at least about 60%, at least about 70%, or at least about 80%.

In addition, each of the first dielectric layers 20 has a top surface 201 and a bottom surface 202 opposite to the top surface 201. The second dielectric layer 26 has a top surface 261 and a bottom surface 262 opposite to the top surface 261. The bottom surface 262 of the second dielectric layer 26 is disposed on and contacts the top surface 201 of the adjacent first dielectric layer 20. Thus, the top surface 21 of the upper conductive structure 2 is the top surface 261 of the second dielectric layer 26, and the bottom surface 22 of the upper conductive structure 2 is the bottom surface 202 of the bottommost first dielectric layer 20. The first dielectric layers 20 and the second dielectric layer 26 may include, or be formed from, a photoresist layer, a cured photosensitive material, a cured photoimageable dielectric (PID) material such as a polyamide (PA), an Ajinomoto build-up film (ABF), a bismaleimide-triazine (BT), a polyimide (PI), epoxy or polybenzoxazole (PBO), or a combination of two or more thereof. In some embodiments, the first dielectric layers 20 and the second dielectric layer 26 may be substantially free of reinforcement element such as glass fiber. That is, the first dielectric layers 20 and the second dielectric layer 26 may include no reinforcement element such as glass fiber, and may include only a homogeneous resin.

The single through hole 23 extends through the upper conductive structure 2; that is, the single through hole 23 extends from the top surface 21 of the upper conductive structure 2 to the bottom surface 22 of the upper conductive structure 2. The single through hole 23 tapers downwardly.

The first circuit layers 24 may be fan-out circuit layers or redistribution layers (RDLs), and an L/S of the first circuit layers 24 may be less than or equal to about 2 μm/about 2 μm, or less than or equal to about 1.8 μm/about 1.8 μm. Each of the first circuit layers 24 has a top surface 241 and a bottom surface 242 opposite to the top surface 241. In some embodiments, the first circuit layer 24 is embedded in the corresponding first dielectric layer 20, and the top surface 241 of the first circuit layer 24 may be substantially coplanar with the top surface 201 of the first dielectric layer 20. In some embodiments, each first circuit layer 24 may include a seed layer 243 and a conductive metallic material 244 disposed on the seed layer 243. As shown in FIG. 1, the bottommost first circuit layer 24 is disposed on and protrudes from the bottom surface 22 of the upper conductive structure 2 (e.g., the bottom surface 202 of the bottommost first dielectric layer 20). In addition, the second circuit layer 28 is disposed on and protrudes from the top surface 21 of the upper conductive structure 2 (e.g., the top surface 261 of the second dielectric layer 26). An L/S of the second circuit layer 28 may be greater than or equal to the L/S of the first circuit layer 24. As illustrated in the embodiment of FIG. 1, a horizontally connecting or extending circuit layer is omitted in the second dielectric layer 26.

The upper conductive structure 2 includes a plurality of inner vias 25. Some of the inner vias 25 are disposed between two adjacent first circuit layers 24 for electrically connecting the two first circuit layers 24. Some of the inner vias 25 are disposed between the first circuit layer 24 and the second circuit layer 28 for electrically connecting the first circuit layer 24 and the second circuit layer 28. In some embodiments, each inner via 25 may include a seed layer 251 and a conductive metallic material 252 disposed on the seed layer 251. In some embodiments, each inner via 25 and the corresponding first circuit layer 24 may be formed integrally as a monolithic or one-piece structure. Each inner via 25 tapers upwardly along a direction from the bottom surface 22 towards the top surface 21 of the upper conductive structure 2. That is, a size (e.g., a width) of a top portion of the inner via 25 is less than a size (e.g., a width) of a bottom portion of the inner via 25 that is closer towards the bottom surface 22. In some embodiments, a maximum width of the inner via 25 (e.g., at the bottom portion) may be less than or equal to about 25 μm, such as about 25 μm, about 20 μm about 15 μm or about 10 μm.

The lower conductive structure 3 includes at least one dielectric layer (including, for example, one first upper dielectric layer 30, one second upper dielectric layer 36, one first lower dielectric layer 30*a* and one second lower dielectric layer 36*a*) and at least one circuit layer (including, for example, one first upper circuit layer 34, two second upper circuit layers 38, 38', one first lower circuit layer 34*a* and two second lower circuit layers 38*a*, 38*a'* formed of a metal, a metal alloy, or other conductive material) in contact with the dielectric layer (e.g., the first upper dielectric layer 30, the second upper dielectric layer 36, the first lower dielectric layer 30*a* and the second lower dielectric layer 36*a*). In some embodiments, the lower conductive structure 3 may be similar to a core substrate that further includes a core portion 37, and may be in a wafer type, a panel type or a strip type. The lower conductive structure 3 may be also referred to as "a stacked structure" or "a low-density conductive structure" or "a low-density stacked structure". The circuit layer (including, for example, the first upper circuit layer 34, the two second upper circuit layers 38, 38', the first lower circuit layer 34*a* and the two second lower circuit layers 38*a*, 38*a'*) of the lower conductive structure 3 may be also referred to as "a low-density circuit layer". As shown in FIG. 1, the lower conductive structure 3 has a top surface 31 and a bottom surface 32 opposite to the top surface 31. The lower conductive structure 3 includes a plurality of dielectric layers (for example, the first upper dielectric layer 30, the second upper dielectric layer 36, the first lower dielectric layer 30*a* and the second lower dielectric layer 36*a*), a plurality of circuit layers (for example, the first upper circuit layer 34, the two second upper circuit layers 38, 38', the first lower circuit layer 34*a* and the two second lower circuit layers 38*a*, 38*a'*) and at least one inner via (including, for example, a plurality of upper interconnection vias 35 and a plurality of lower interconnection vias 35*a*).

The core portion 37 has a top surface 371 and a bottom surface 372 opposite to the top surface 371, and defines a plurality of through holes 373 extending through the core portion 37. An interconnection via 39 is disposed or formed in each through hole 373 for vertical connection. In some embodiments, each interconnection via 39 includes a base metallic layer 391 and an insulation material 392. The base metallic layer 391 is disposed or formed on a side wall of the through hole 373, and defines a central through hole. The insulation material 392 fills the central through hole defined by the base metallic layer 391. In some embodiments, the interconnection via 39 may omit an insulation material, and may include a bulk metallic material that fills the through hole 373.

In some embodiments, the core portion 37 and the dielectric layer (including, for example, one first upper dielectric layer 30, one second upper dielectric layer 36, one first lower dielectric layer 30*a* and one second lower dielectric layer 36*a*) of the lower conductive structure 3 may include reinforcement elements such as glass fibers. In addition, a material of the core portion 37 and the dielectric layer (including, for example, one first upper dielectric layer 30, one second upper dielectric layer 36, one first lower dielectric layer 30*a* and one second lower dielectric layer 36*a*) of the lower conductive structure 3 may include a non-photosensitive material such as polypropylene (PP), Ajinomoto build-up film (ABF), bismaleimide-triazine (BT), polyimide (PI), epoxy or polybenzoxazole (PBO).

The first upper dielectric layer 30 is disposed on the top surface 371 of the core portion 37, and has a top surface 301 and a bottom surface 302 opposite to the top surface 301. Thus, the bottom surface 302 of the first upper dielectric layer 30 contacts the top surface 371 of the core portion 37. The second upper dielectric layer 36 is stacked or disposed on the first upper dielectric layer 30, and has a top surface 361 and a bottom surface 362 opposite to the top surface 361. Thus, the bottom surface 362 of the second upper dielectric layer 36 contacts the top surface 301 of the first upper dielectric layer 30, and the second upper dielectric layer 36 is the topmost dielectric layer. In addition, the first lower dielectric layer 30*a* is disposed on the bottom surface 372 of the core portion 37, and has a top surface 301*a* and a bottom surface 302*a* opposite to the top surface 301*a*. Thus, the top surface 301*a* of the first lower dielectric layer 30*a* contacts the bottom surface 372 of the core portion 37. The second lower dielectric layer 36*a* is stacked or disposed on the first lower dielectric layer 30*a*, and has a top surface 361*a* and a bottom surface 362*a* opposite to the top surface 361*a*. Thus, the top surface 361*a* of the second lower dielectric layer 36*a* contacts the bottom surface 302*a* of the first lower dielectric layer 30*a*, and the second lower dielectric layer 36*a* is the bottommost dielectric layer. As shown in FIG. 1, the top surface 31 of the lower conductive structure 3 is the top surface 361 of the second upper dielectric layer 36, and the bottom surface 32 of the lower conductive structure 3 is the bottom surface 362*a* of the second lower dielectric layer 36*a*.

A thickness of each of the dielectric layers (e.g., the first dielectric layers 20 and the second dielectric layer 26) of the upper conductive structure 2 is less than or equal to about 40%, less than or equal to about 35%, less than or equal to about 30% of a thickness of each of the dielectric layers (e.g., the first upper dielectric layer 30, the second upper dielectric layer 36, the first lower dielectric layer 30*a* and the second lower dielectric layer 36*a*) of the lower conductive structure 3. For example, a thickness of each of the dielectric layers (e.g., the first dielectric layers 20 and the second dielectric layer 26) of the upper conductive structure 2 may be less than or equal to about 7 μm, and a thickness of each of the dielectric layers (e.g., the first upper dielectric layer 30, the second upper dielectric layer 36, the first lower dielectric layer 30*a* and the second lower dielectric layer 36*a*) of the lower conductive structure 3 may be about 40 μm.

An L/S of the first upper circuit layer 34 may be greater than or equal to about 10 μm/about 10 μm. Thus, the L/S of the first upper circuit layer 34 may be greater than or equal to about five times the L/S of the first circuit layers 24 of the upper conductive structure 2. The first upper circuit layer 34 has a top surface 341 and a bottom surface 342 opposite to the top surface 341. In some embodiments, the first upper circuit layer 34 is formed or disposed on the top surface 371 of the core portion 37, and covered by the first upper dielectric layer 30. The bottom surface 342 of the first upper circuit layer 34 contacts the top surface 371 of the core portion 37. In some embodiments, the first upper circuit layer 34 may include a first metallic layer 343, a second metallic layer 344 and a third metallic layer 345. The first metallic layer 343 is disposed on the top surface 371 of the core portion 37, and may be formed from a copper foil (e.g., may constitute a portion of the copper foil). The second metallic layer 344 is disposed on the first metallic layer 343, and may be a plated copper layer. The third metallic layer 345 is disposed on the second metallic layer 344, and may be another plated copper layer. In some embodiments, the third metallic layer 345 may be omitted.

An L/S of the second upper circuit layer 38 may be greater than or equal to about 10 μm/about 10 μm. Thus, the L/S of the second upper circuit layer 38 may be substantially equal to the L/S of the first upper circuit layer 34, and may be greater than or equal to about five times the L/S of the first circuit layers 24 of the upper conductive structure 2. The second upper circuit layer 38 has a top surface 381 and a bottom surface 382 opposite to the top surface 381. In some embodiments, the second upper circuit layer 38 is formed or disposed on the top surface 301 of the first upper dielectric layer 30, and covered by the second upper dielectric layer 36. The bottom surface 382 of the second upper circuit layer 38 contacts the top surface 301 of the first upper dielectric layer 30. In some embodiments, the second upper circuit layer 38 is electrically connected to the first upper circuit layer 34 through the upper interconnection vias 35. That is, the upper interconnection vias 35 are disposed between the second upper circuit layer 38 and the first upper circuit layer 34 for electrically connecting the second upper circuit layer 38 and the first upper circuit layer 34. In some embodiments, the second upper circuit layer 38 and the upper interconnection vias 35 are formed integrally as a monolithic or one-piece structure. Each upper interconnection via 35 tapers downwardly along a direction from the top surface 31 towards the bottom surface 32 of the lower conductive structure 3.

In addition, in some embodiments, the second upper circuit layer 38' is disposed on and protrudes from the top surface 361 of the second upper dielectric layer 36 (i.e., the top surface 31 of the lower conductive structure 3). The second upper circuit layer 38' may be a topmost circuit layer that protrudes from the top surface 31 of the lower conductive structure 3. In some embodiments, the second upper circuit layer 38 is electrically connected to the second upper circuit layer 38' through the upper interconnection vias 35. That is, the upper interconnection vias 35 are disposed between the second upper circuit layers 38, 38' for electrically connecting the second upper circuit layers 38, 38'. In some embodiments, the second upper circuit layer 38' and the upper interconnection vias 35 are formed integrally as a monolithic or one-piece structure.

An L/S of the first lower circuit layer 34*a* may be greater than or equal to about 10 μm/about 10 μm. Thus, the L/S of the first lower circuit layer 34*a* may be greater than or equal to about five times the L/S of the first circuit layers 24 of the upper conductive structure 2. The first lower circuit layer 34*a* has a top surface 341*a* and a bottom surface 342*a* opposite to the top surface 341*a*. In some embodiments, the first lower circuit layer 34*a* is formed or disposed on the bottom surface 372 of the core portion 37, and covered by the first lower dielectric layer 30*a*. The top surface 341*a* of the first lower circuit layer 34*a* contacts the bottom surface 372 of the core portion 37. In some embodiments, the first lower circuit layer 34*a* may include a first metallic layer 343*a*, a second metallic layer 344*a* and a third metallic layer 345*a*. The first metallic layer 343*a* is disposed on the bottom surface 372 of the core portion 37, and may be formed from a copper foil. The second metallic layer 344*a* is disposed on the first metallic layer 343*a*, and may be a plated copper layer. The third metallic layer 345*a* is disposed on the second metallic layer 344*a*, and may be another plated copper layer. In some embodiments, the third metallic layer 345*a* may be omitted.

An L/S of the second lower circuit layer 38*a* may be greater than or equal to about 10 μm/about 10 μm. Thus, the L/S of the second lower circuit layer 38*a* may be substantially equal to the L/S of the first upper circuit layer 34, and may be greater than or equal to about five times the L/S of the first circuit layers 24 of the upper conductive structure 2. The second lower circuit layer 38*a* has a top surface 381*a* and a bottom surface 382*a* opposite to the top surface 381*a*. In some embodiments, the second lower circuit layer 38*a* is formed or disposed on the bottom surface 302*a* of the first lower dielectric layer 30*a*, and covered by the second lower dielectric layer 36*a*. The top surface 381*a* of the second lower circuit layer 38*a* contacts the bottom surface 302*a* of the first lower dielectric layer 30*a*. In some embodiments, the second lower circuit layer 38*a* is electrically connected to the first lower circuit layer 34*a* through the lower interconnection vias 35*a*. That is, the lower interconnection vias 35*a* are disposed between the second lower circuit layer 38*a* and the first lower circuit layer 34*a* for electrically connecting the second lower circuit layer 38*a* and the first lower circuit layer 34*a*. In some embodiments, the second lower circuit layer 38*a* and the lower interconnection vias 35*a* are formed integrally as a monolithic or one-piece structure. The lower interconnection vias 35*a* tapers upwardly along a direction from the bottom surface 32 towards the top surface 31 of the lower conductive structure 3.

In addition, in some embodiments, the second lower circuit layer 38*a'* is disposed on and protrudes from the bottom surface 362*a* of the second lower dielectric layer 36*a*. In some embodiments, the second lower circuit layer 38*a'* is electrically connected to the second lower circuit layer 38*a* through the lower interconnection vias 35*a*. That is, the lower interconnection vias 35*a* are disposed between the second lower circuit layers 38*a*, 38*a'* for electrically connecting the second lower circuit layers 38$a$, 38$a'$. In some embodiments, the second lower circuit layer 38$a'$ and the lower interconnection vias 35$a$ are formed integrally as a monolithic or one-piece structure.

In some embodiments, each interconnection via 39 electrically connects the first upper circuit layer 34 and the first lower circuit layer 34$a$. The base metallic layer 391 of the interconnection via 39, the second metallic layer 344 of the first upper circuit layer 34 and the second metallic layer 344$a$ the first lower circuit layer 34$a$ may be formed integrally and concurrently as a monolithic or one-piece structure.

As shown in FIG. 1, the lower conductive structure 3 may be also referred to as "a first conductive structure" or "a first stacked structure", and the upper conductive structure 2 may be also referred to as "a second conductive structure" or "a second stacked structure". A gap $g_1$ is defined between the bottom surface 22 of the upper conductive structure 2 (or the second conductive structure) and the top surface 31 of the lower conductive structure 3 (or the first conductive structure). The dent structure 8 is attached to the lower conductive structure 3 (or the first conductive structure). As shown in FIG. 1, the dent structure 8 may have a top surface 81, a bottom surface 82 opposite to the top surface 81, and an inner surface 83 extending between the top surface 81 and the bottom surface 82. The dent structure 8 has a thickness $t_1$. The bottom surface 82 of the dent structure 8 is disposed on and contacts the top surface 31 of the lower conductive structure 3 (or the first conductive structure) directly. The dent structure 8 may be a ring structure, and the inner surface 83 of the dent structure 8 and the top surface 31 of the lower conductive structure 3 (or the first conductive structure) may jointly define a central cavity 84. The top surface 81 of the dent structure 8 is spaced apart from the bottom surface 22 of the upper conductive structure 2 (or the second conductive structure). A gap $g_2$ is defined between the bottom surface 22 of the upper conductive structure 2 (or the second conductive structure) and the top surface 81 of the dent structure 8. In some embodiments, the thickness $t_1$ of the dent structure 8 is less than the gap $g_1$ between the bottom surface 22 of the upper conductive structure 2 (or the second conductive structure) and the top surface 31 of the lower conductive structure 3 (or the first conductive structure). Further, $g_1=t_1+g_2$. In addition, the thickness $t_1$ of the dent structure 8 may be greater than or equal to a thickness t2 of the topmost circuit layer 38' of the lower conductive structure 3 (or the first conductive structure). In some embodiments, a material of the dent structure 8 may be same as or different from a material of the second upper dielectric layer 36 of the lower conductive structure 3 (or the first conductive structure).

The adhesion layer 12 is interposed or disposed between the upper conductive structure 2 and the lower conductive structure 3 to bond the upper conductive structure 2 and the lower conductive structure 3 together. That is, the adhesion layer 12 adheres to the bottom surface 22 of the upper conductive structure 2 and the top surface 31 of the lower conductive structure 3. In some embodiments, the adhesion layer 12 may be cured from an adhesive material (e.g., includes a cured adhesive material such as an adhesive polymetric material). The adhesion layer 12 has a top surface 121 and a bottom surface 122 opposite to the top surface 121. The top surface 121 of the adhesion layer 12 contacts the bottom surface 22 of the upper conductive structure 2 (that is, the bottom surface 22 of the upper conductive structure 2 is attached to the top surface 121 of the adhesion layer 12), and the bottom surface 122 of the adhesion layer 12 contacts the top surface 31 of the lower conductive structure 3. Thus, the bottommost first circuit layer 24 of the upper conductive structure 2 and the topmost circuit layer 38' (e.g., the second upper circuit layer 38') of the lower conductive structure 3 are embedded in the adhesion layer 12. In some embodiments, a bonding force between two adjacent dielectric layers (e.g., two adjacent first dielectric layers 20) of the upper conductive structure 2 is greater than a bonding force between a dielectric layer (e.g., the bottommost first dielectric layers 20) of the upper conductive structure 2 and the adhesion layer 12. A surface roughness of a boundary between two adjacent dielectric layers (e.g., two adjacent first dielectric layers 20) of the upper conductive structure 2 is greater than a surface roughness of a boundary between a dielectric layer (e.g., the bottommost first dielectric layers 20) of the upper conductive structure 2 and the adhesion layer 12, such as about 1.1 times or greater, about 1.3 times or greater, or about 1.5 times or greater in terms of root mean squared surface roughness.

In some embodiments, a periphery portion 124 of the adhesion layer 12 may be disposed in the gap $g_2$ between the bottom surface 22 of the upper conductive structure 2 (or the second conductive structure) and the top surface 81 of the dent structure 8. A material of the adhesion layer 12 is transparent, and can be seen through by human eyes or machine. That is, a mark disposed adjacent to the top surface 31 of the lower conductive structure 3 can be recognized or detected from the top surface 21 of the upper conductive structure 2 by human eyes or machine. In some embodiments, the adhesion layer 12 is substantially free of reinforcement element such as glass fiber. That is, the adhesion layer 12 may include no reinforcement element such as glass fiber, and may include only a homogeneous resin. Alternatively, the adhesion layer 12 may include very few reinforcement element such as glass fiber. In addition, a material of the adhesion layer 12 may include Ajinomoto build-up film (ABF).

The through hole 23 further extends through the adhesion layer 12. In some embodiments, the through hole 23 may extend through the bottommost first circuit layer 24 of the upper conductive structure 2 and terminate at or on a topmost circuit layer (e.g., the second upper circuit layer 38') of the lower conductive structure 3. That is, the through hole 23 does not extend through the topmost circuit layer (e.g., the second upper circuit layer 38') of the lower conductive structure 3. The through hole 23 may expose a portion of the topmost circuit layer (e.g., the top surface of the second upper circuit layer 38') of the lower conductive structure 3.

As shown in FIG. 1, a cross-sectional view of one side of the through hole 23 may be a substantially straight line. The single through hole 23 extends through the upper conductive structure 2 and the adhesion layer 12; that is, the single through hole 23 extends from the top surface 21 of the upper conductive structure 2 to the bottom portion of the adhesion layer 12 to expose a portion of the topmost circuit layer (e.g., the top surface of the second upper circuit layer 38') of the lower conductive structure 3. A maximum width (e.g., at the top portion) of the single through hole 23 may be about 25 μm to about 60 μm.

The upper through via 14 is formed or disposed in the corresponding single through hole 23, and is formed of a metal, a metal alloy, or other conductive material. Thus, the upper through via 14 extends through at least a portion of the upper conductive structure 2 (or the second conductive structure) and the adhesion layer 12, and is electrically connected to the topmost circuit layer (e.g., the top surface of the second upper circuit layer 38') of the lower conductive structure 3 (or the first conductive structure). As shown in FIG. 1, the upper through via 14 extends through and contacts the bottommost first circuit layer 24 of the upper conductive structure 2, and terminates at or on, and contacts a portion of the topmost circuit layer (e.g., the top surface of the second upper circuit layer 38') of the lower conductive structure 3. The upper through via 14 extends from the top surface 21 of the upper conductive structure 2 to the bottom surface 122 of the adhesion layer 12. Thus, the upper through via 14 extends to contact a portion of the lower conductive structure 3, and the upper through via 14 does not extend through the lower conductive structure 3. In some embodiments, a low-density circuit layer (e.g., the second upper circuit layer 38') of the low-density conductive structure (e.g., the lower conductive structure 3) is electrically connected to a high-density circuit layer (e.g., the bottommost first circuit layer 24) of the high-density conductive structure (e.g., the upper conductive structure 2) solely by the upper through via 14. A length (along a longitudinal axis) of the upper through via 14 is greater than a thickness of the high-density conductive structure (e.g., the upper conductive structure 2). Further, the upper through via 14 tapers downwardly; that is, a size of a top portion of the upper through via 14 is greater than a size of a bottom portion of the upper through via 14. Thus, a tapering direction of the inner via 25 of the upper conductive structure 2 is different from a tapering direction of the upper through via 14. In some embodiments, the upper through via 14 is a monolithic structure or a one-piece structure having a homogeneous material composition, and a peripheral surface 143 of the upper through via 14 is a substantially continuous surface without boundaries. The upper through via 14 and the second circuit layer 28 may be formed integrally as a monolithic or one-piece structure. In some embodiments, a maximum width of the upper through via 14 may be less than about 40 μm, such as about 30 μm or about 20 μm.

Figure 2:
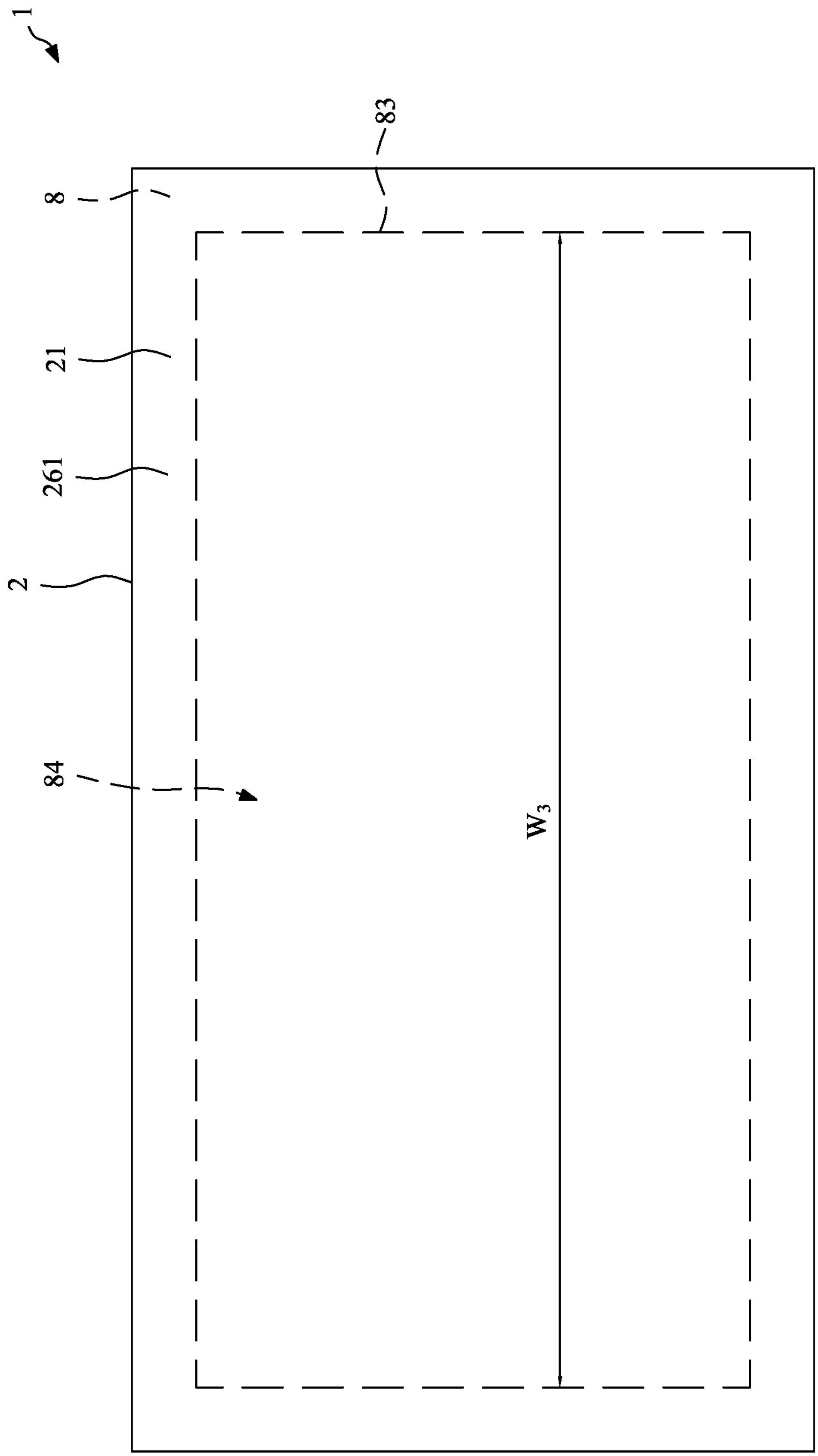
FIG. 2 illustrates a top view of the wiring structure of FIG. 1, wherein a second circuit layer of the upper conductive structure is omitted for the purpose of the clear explanation.

FIG. 2 illustrates a top view of the wiring structure 1 of FIG. 1, wherein a second circuit layer 28 of the upper conductive structure 2 is omitted for the purpose of the clear explanation. As shown in FIG. 2, the dent structure 8 is an enclosed loop from a top view. That is, the dent structure 8 may be a continuous ring. For example, the dent structure 8 may include four strip structures that are disposed adjacent to four lateral peripheral surfaces of the wiring structure 1 respectively. The central cavity 84 may have a width $W_3$. As shown in FIG. 1, a lateral peripheral surface 27 of the upper conductive structure 2, a lateral peripheral surface 87 of the dent structure 8, a lateral peripheral surface 127 of the adhesion layer 12 and a lateral peripheral surface 33 of the lower conductive structure 3 are substantially coplanar with each other.

As shown in the embodiment illustrated in FIG. 1 and FIG. 2, the wiring structure 1 is a combination of the upper conductive structure 2 and the lower conductive structure 3, in which the first circuit layer 24 of the upper conductive structure 2 has fine pitch, high yield and low thickness; and the circuit layers (e.g., the first upper circuit layer 34, the second upper circuit layers 38, 38', the first lower circuit layer **34*a* and the second lower circuit layers 38*a*, 38*a*') of the lower conductive structure 3 have low manufacturing cost. Thus, the wiring structure 1 has an advantageous compromise of yield and manufacturing cost, and the wiring structure 1 has a relatively low thickness. In some embodiments, if a package has 10000 I/O counts, the wiring structure 1 includes three layers of the first circuit layers 24 of the upper conductive structure 2 and six layers of the circuit layers (e.g., the first upper circuit layer 34, the second upper circuit layers 38, 38', the first lower circuit layer 34*a* and the second lower circuit layers 38*a*, 38*a*') of the lower conductive structure 3. The manufacturing yield for one layer of the first circuit layers 24 of the upper conductive structure 2 may be 99%, and the manufacturing yield for one layer of the circuit layers (e.g., the first upper circuit layer 34, the second upper circuit layers 38, 38', the first lower circuit layer 34*a* and the second lower circuit layers 38*a*, 38*a*') of the lower conductive structure 3 may be 90%. Thus, the yield of the wiring structure 1 may be improved. In addition, the warpage of the upper conductive structure 2 and the warpage of the lower conductive structure 3 are separated and will not influence each other. In some embodiments, a warpage shape of the upper conductive structure 2 may be different from a warpage shape of the lower conductive structure 3. For example, the warpage shape of the upper conductive structure 2 may be a convex shape, and the warpage shape of the lower conductive structure 3 may be a concave shape. In some embodiments, the warpage shape of the upper conductive structure 2 may be the same as the warpage shape of the lower conductive structure 3; however, the warpage of the lower conductive structure 3 will not be accumulated onto the warpage of the upper conductive structure 2. Thus, the yield of the wiring structure 1** may be further improved.

Further, during a manufacturing process, the lower conductive structure 3 and the upper conductive structure 2 may be tested individually before being bonded together. Therefore, known good lower conductive structure 3 and known good upper conductive structure 2 may be selectively bonded together. Bad (or unqualified) lower conductive structure 3 and bad (or unqualified) upper conductive structure 2 may be discarded. As a result, the yield of the wiring structure 1 may be further improved.

In addition, most of the adhesion layer 12 may be limited or restrained in the central cavity 84 of the dent structure 8 before the adhesion layer 12 is cured. That is, when the adhesion layer 12 is fluid or in the B-stage, no portion of the adhesion layer 12 or a very few portion of the adhesion layer 12 will leak out from dent structure 8. Thus, the upper conductive structure 2 may not delaminate from or peel off from the lower conductive structure 3, and the quality of the bonding between the lower conductive structure 3 and the upper conductive structure 2 is improved. As a result, the yield of the wiring structure 1 may be further improved.

Figure 3:
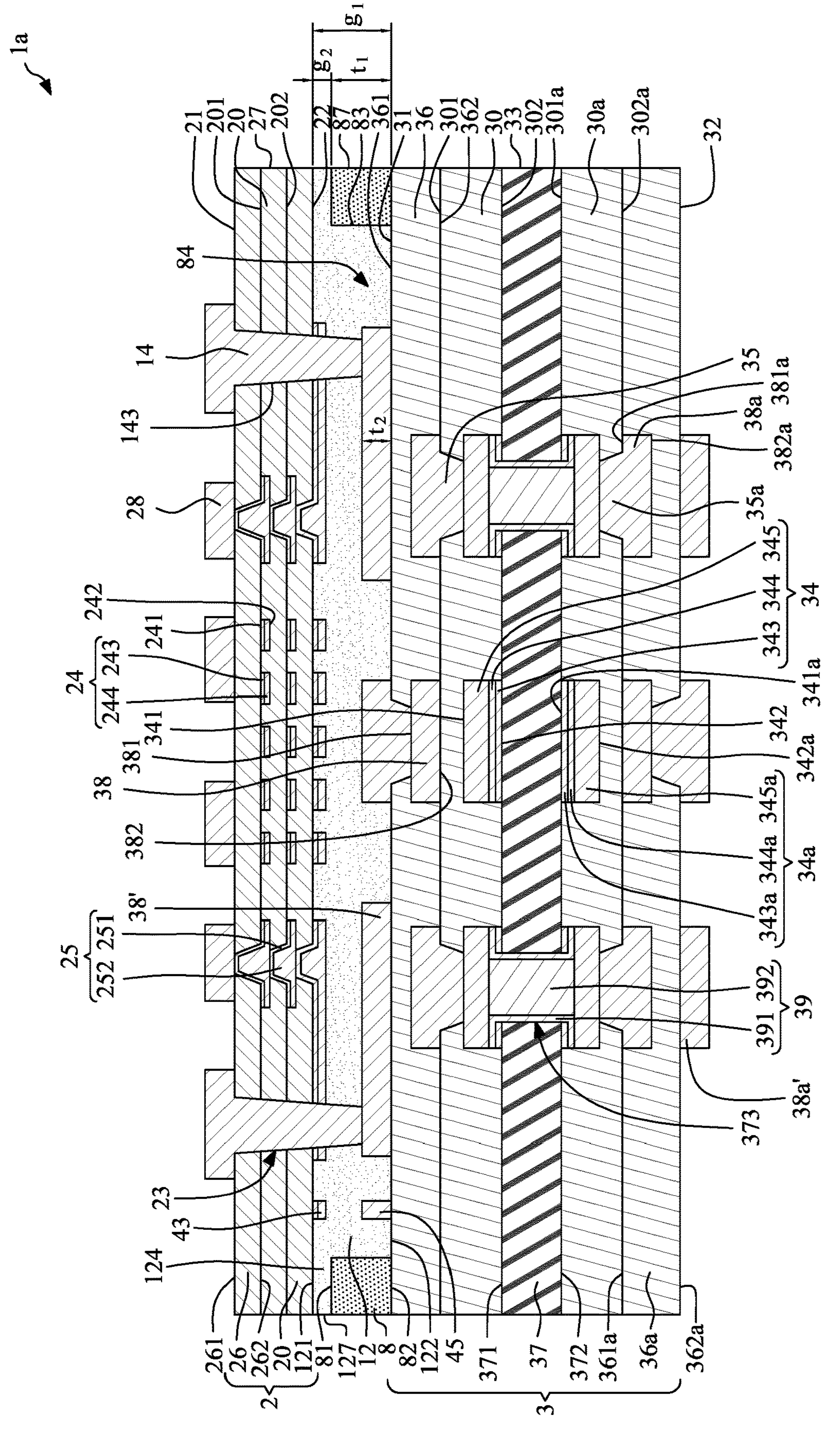
FIG. 3 illustrates a cross-sectional view of a wiring structure according to some embodiments of the present disclosure.

FIG. 3 illustrates a cross-sectional view of a wiring structure **1*a* according to some embodiments of the present disclosure. The wiring structure 1*a* is similar to the wiring structure 1 shown in FIG. 1, except that at least one fiducial mark 43 and at least one fiducial mark 45 are further included. As shown in FIG. 3, the upper conductive structure 2 includes at least one fiducial mark 43 at a corner thereof, and the lower conductive structure 3 includes at least one fiducial mark 45 at a corner thereof. The fiducial mark 43 of the upper conductive structure 2 is aligned with a fiducial mark 45 of the lower conductive structure 3 during a manufacturing process, so that the relative position of the upper conductive structure 2 and the lower conductive structure 3 is secured. In some embodiments, the fiducial mark 43 of the upper conductive structure 2 may be disposed on and protrude from the bottom surface 22 of the upper conductive structure 2 (e.g., the bottom surface 202 of the bottommost first dielectric layer 20). The fiducial mark 43 and the bottommost first circuit layer 24 may be at, or part of, the same layer, and may be formed concurrently. Further, the fiducial mark 45 of the lower conductive structure 3 may be disposed on and protrude from the top surface 31 of the lower conductive structure 3 (e.g., the top surface 361 of the second upper dielectric layer 36). The fiducial mark 45 and the second upper circuit layer 38'** may be at, or part of, the same layer, and may be formed concurrently.

Figure 3A:
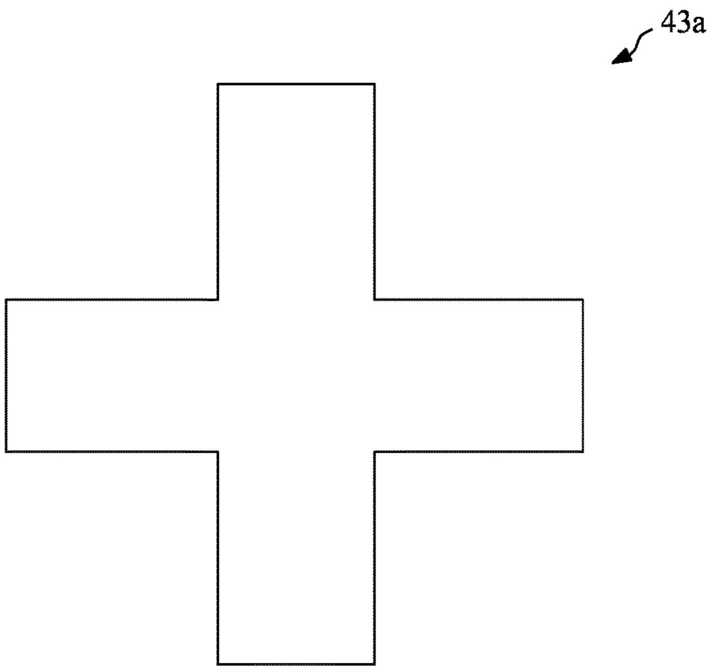
FIG. 3A illustrates a top view of an example of a fiducial mark of an upper conductive structure according to some embodiments of the present disclosure.

FIG. 3A illustrates a top view of an example of a fiducial mark 43*a* of the upper conductive structure 2 according to some embodiments of the present disclosure. The fiducial mark 43*a* of the upper conductive structure 2 has a continuous cross shape.

Figure 3B:
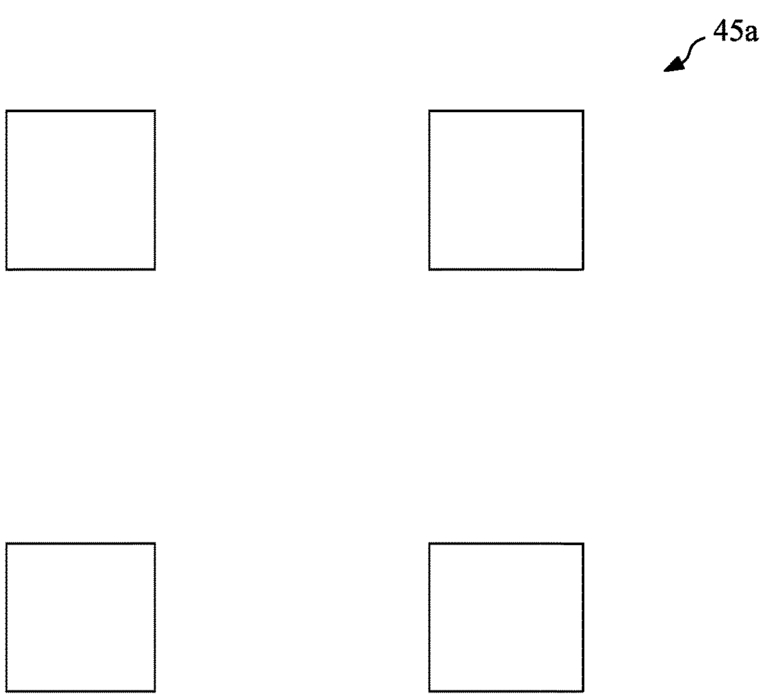
FIG. 3B illustrates a top view of an example of a fiducial mark of a lower conductive structure according to some embodiments of the present disclosure.

FIG. 3B illustrates a top view of an example of a fiducial mark 45*a* of the lower conductive structure 3 according to some embodiments of the present disclosure. The fiducial mark 45*a* of the lower conductive structure 3 includes four square-shaped segments spaced apart at four corners.

Figure 3C:
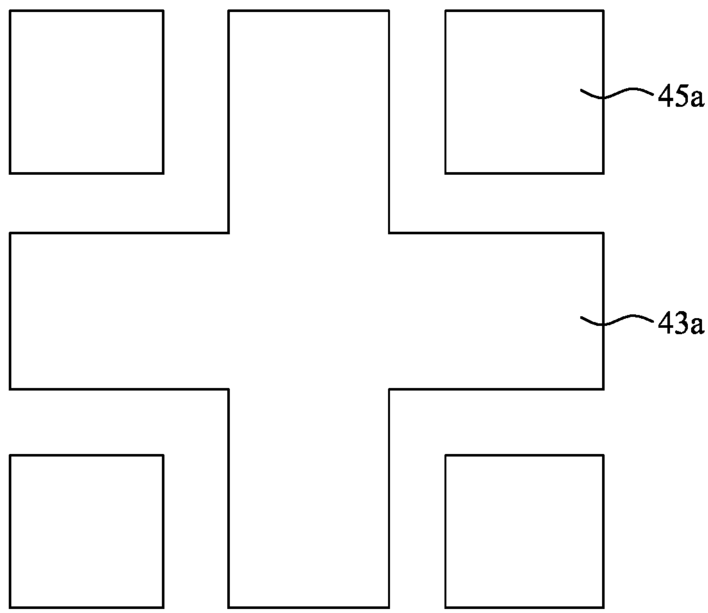
FIG. 3C illustrates a top view of a combination image of the fiducial mark of a upper conductive structure of FIG. 3A and the fiducial mark of the lower conductive structure of FIG. 3B.

FIG. 3C illustrates a top view of a combination image of the fiducial mark 43*a* of the upper conductive structure 2 of FIG. 3A and the fiducial mark 45*a* of the lower conductive structure 3 of FIG. 3B. When the upper conductive structure 2 is aligned with the lower conductive structure 3 precisely, the combination image shows the complete fiducial mark 43*a* and the complete fiducial mark 45*a*, as shown in FIG. 3C. That is, the fiducial mark 43*a* does not cover or overlap the fiducial mark 45*a* from the top view.

Figure 3D:
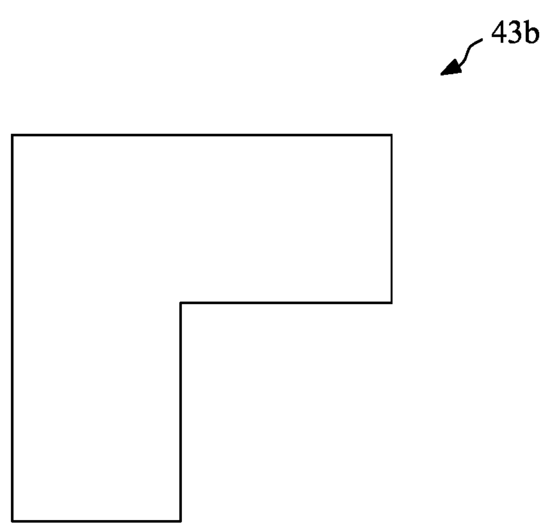
FIG. 3D illustrates a top view of an example of a fiducial mark of an upper conductive structure according to some embodiments of the present disclosure.

FIG. 3D illustrates a top view of an example of a fiducial mark 43*b* of the upper conductive structure 2 according to some embodiments of the present disclosure. The fiducial mark 43*b* of the upper conductive structure 2 has a continuous reversed "L" shape.

Figure 3E:
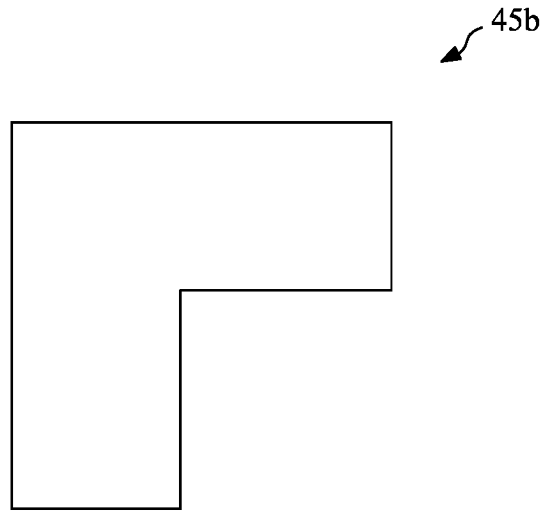
FIG. 3E illustrates a top view of an example of a fiducial mark of a lower conductive structure according to some embodiments of the present disclosure.

FIG. 3E illustrates a top view of an example of a fiducial mark 45*b* of the lower conductive structure 3 according to some embodiments of the present disclosure. The fiducial mark 45*b* of the lower conductive structure 3 has a continuous reversed "L" shape which is substantially the same as the fiducial mark 43*b* of the upper conductive structure 2.

Figure 3F:
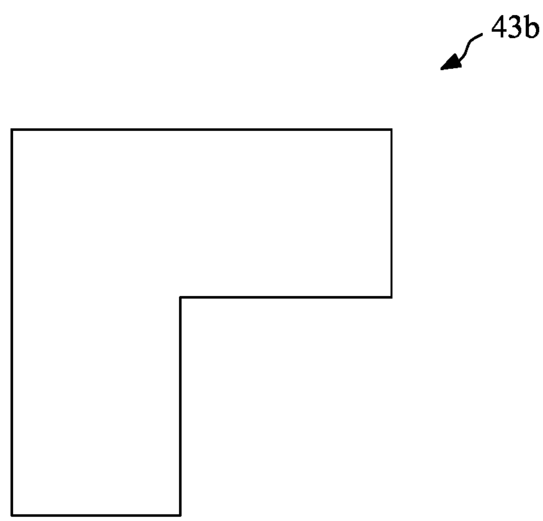
FIG. 3F illustrates a top view of a combination image of the fiducial mark of the upper conductive structure of FIG. 3D and the fiducial mark of the lower conductive structure of FIG. 3E.

FIG. 3F illustrates a top view of a combination image of the fiducial mark 43*b* of the upper conductive structure 2 of FIG. 3D and the fiducial mark 45*b* of the lower conductive structure 3 of FIG. 3E. When the upper conductive structure 2 is aligned with the lower conductive structure 3 precisely, the combination image shows solely the fiducial mark 43*b* of the upper conductive structure 2, as shown in FIG. 3F. That is, the fiducial mark 43*b* completely covers or overlaps the fiducial mark 45*b* from the top view.

Figure 3G:
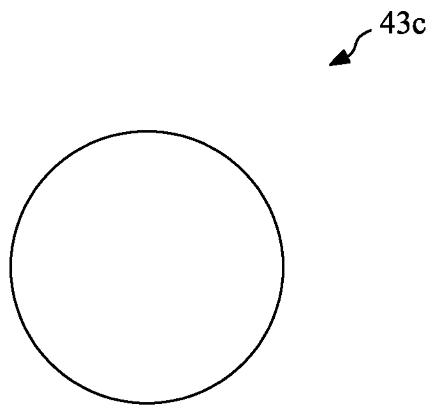
FIG. 3G illustrates a top view of an example of a fiducial mark of an upper conductive structure according to some embodiments of the present disclosure.

FIG. 3G illustrates a top view of an example of a fiducial mark 43*c* of the upper conductive structure 2 according to some embodiments of the present disclosure. The fiducial mark 43*c* of the upper conductive structure 2 has a continuous circular shape.

Figure 3H:
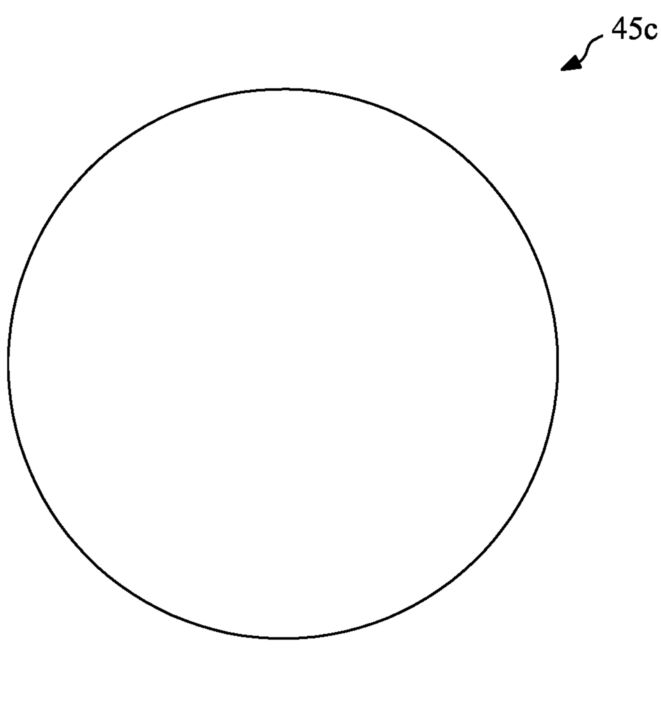
FIG. 3H illustrates a top view of an example of a fiducial mark of a lower conductive structure according to some embodiments of the present disclosure.

FIG. 3H illustrates a top view of an example of a fiducial mark 45*c* of the lower conductive structure 3 according to some embodiments of the present disclosure. The fiducial mark 45*c* of the lower conductive structure 3 has a continuous circular shape which is larger than the fiducial mark 43*c* of the upper conductive structure 2.

Figure 3I:
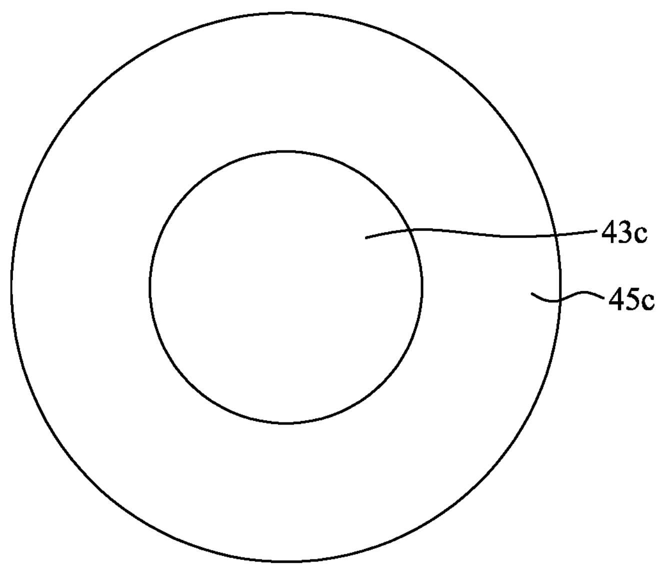
FIG. 3I illustrates a top view of a combination image of the fiducial mark of the upper conductive structure of FIG. 3G and the fiducial mark of the lower conductive structure of FIG. 3H.

FIG. 3I illustrates a top view of a combination image of the fiducial mark 43*c* of the upper conductive structure 2 of FIG. 3G and the fiducial mark 45*c* of the lower conductive structure 3 of FIG. 3H. When the upper conductive structure 2 is aligned with the lower conductive structure 3 precisely, the combination image shows two concentric circles, as shown in FIG. 3I. That is, the fiducial mark 43*c* is disposed at the center of the fiducial mark 45*b*.

Figure 4:
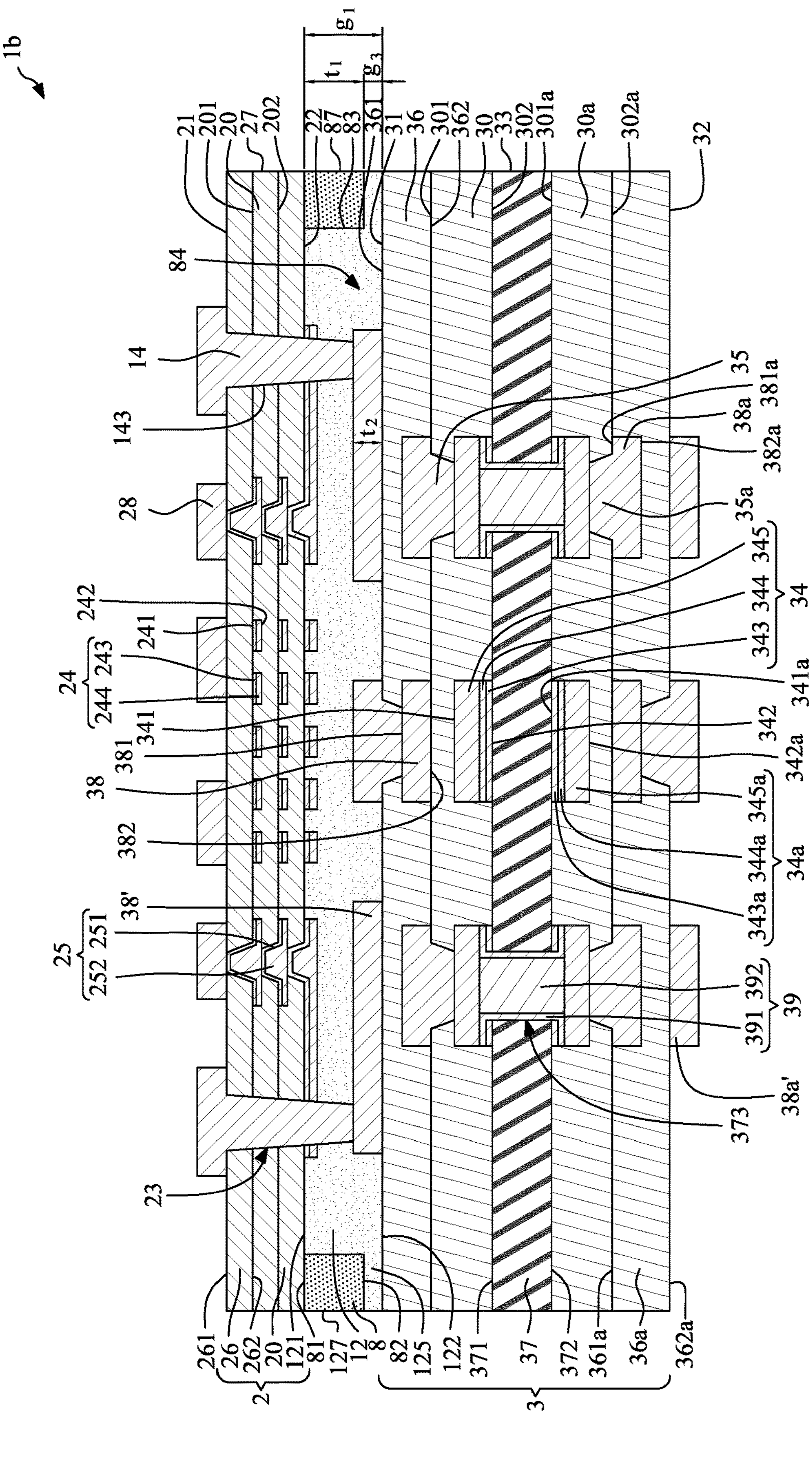
FIG. 4 illustrates a cross-sectional view of a wiring structure according to some embodiments of the present disclosure.

FIG. 4 illustrates a cross-sectional view of a wiring structure 1*b* according to some embodiments of the present disclosure. The wiring structure 1*b* is similar to the wiring structure 1 shown in FIG. 1, except for a position of the dent structure 8. It is noted that the lower conductive structure 3 of FIG. 4 may be also referred to as "a second conductive structure", and the upper conductive structure 2 may be also referred to as "a first conductive structure". An L/S of the circuit layer of the second conductive structure (i.e., the lower conductive structure 3) is greater than an L/S of the circuit layer of the first conductive structure (i.e., the upper conductive structure 2).

The dent structure 8 is attached to the upper conductive structure 2 (or the first conductive structure). The top surface 81 of the dent structure 8 is disposed on and contacts the bottom surface 22 of the upper conductive structure 2 (or the first conductive structure) directly. The inner surface 83 of the dent structure 8 and the bottom surface 22 of the upper conductive structure 2 (or the first conductive structure) may jointly define the central cavity 84. The bottom surface 82 of the dent structure 8 is spaced apart from the top surface 31 of the lower conductive structure 3 (or the second conductive structure). A gap $g_3$ is defined between the top surface 31 of the lower conductive structure 3 (or the second conductive structure) and the bottom surface 82 of the dent structure 8. A periphery portion 125 of the adhesion layer 12 may be disposed in the gap $g_3$ between the top surface 31 of the lower conductive structure 3 (or the second conductive structure) and the bottom surface 82 of the dent structure 8.

Figure 5:
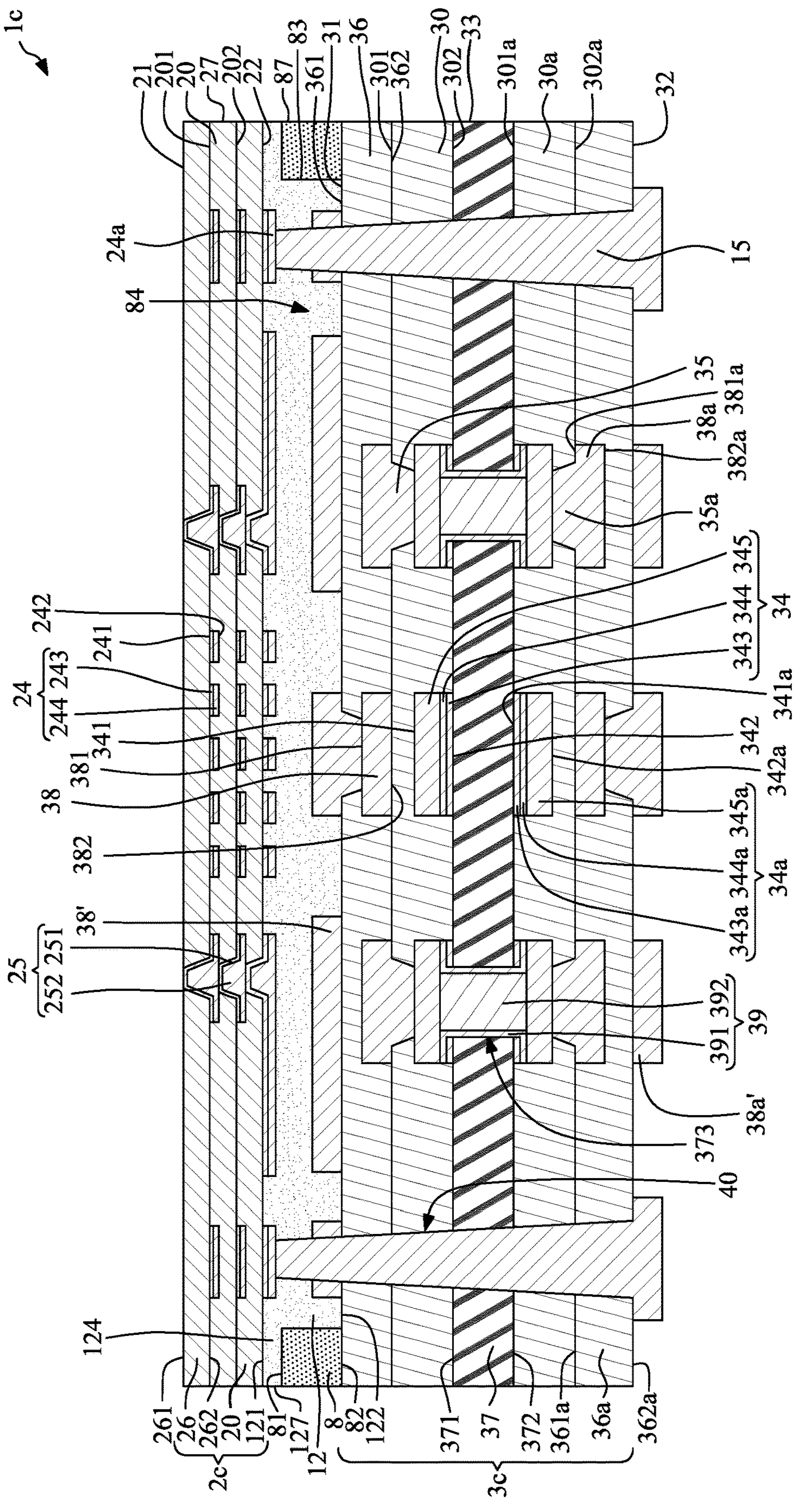
FIG. 5 illustrates a cross-sectional view of a wiring structure according to some embodiments of the present disclosure.

FIG. 5 illustrates a cross-sectional view of a wiring structure 1*c* according to some embodiments of the present disclosure. The wiring structure 1*c* is similar to the wiring structure 1 shown in FIG. 1, except for structures of an upper conductive structure 2*c* and a lower conductive structure 3*c*. In addition, the upper through via 14 of FIG. 1 is omitted, and at least one lower through via 15 is further included in the wiring structure 1*c* of FIG. 5. As shown in FIG. 5, the wiring structure 1*c* defines a through hole 40 extending through the lower conductive structure 3*c* and the adhesion layer 12. The through hole 40 tapers upwardly. In addition, a thickness of a bottommost first circuit layer 24*a* of the upper conductive structure 2*c* is greater than a thickness of the other first circuit layers 24, such as about 1.1 times or greater, about 1.3 times or greater, or about 1.5 times or greater. For example, the thickness of the bottommost first circuit layer 24*a* may be about 4 μm, and the thickness of the other first circuit layer 24 may be about 3 μm. This is because the bottommost first circuit layer 24*a* may be used to block a laser beam in a manufacturing process. The bottommost first circuit layer 24*a* may be disposed on and protrudes from the bottom surface 22 of the upper conductive structure 2*c* (e.g., the bottom surface 202 of the bottommost first dielectric layer 20).

The lower through via 15 is formed or disposed in the through hole 40. Thus, the lower through via 15 extends through at least a portion of the lower conductive structure 3*c* and the adhesion layer 12, and is electrically connected to a circuit layer (e.g., the bottommost first circuit layer 24*a*) of the upper conductive structure 2*c*. As shown in FIG. 5, the lower through via 15 extends through and contacts the topmost circuit layer (e.g., the second upper circuit layer 38') of the lower conductive structure 3*c*, and terminates at or on, and contacts a portion of the bottommost circuit layer (e.g., the bottommost first circuit layer 24*a*) of the upper conductive structure 2*c*. A length of the lower through via 15 is greater than a thickness of the lower conductive structure 3*c*. Further, the lower through via 15 tapers upwardly. Thus, a tapering direction of the inner via 25 of the upper conductive structure 2*c* is the same as a tapering direction of the lower through via 15. In some embodiments, the lower through via 15 and the second lower circuit layer 38*a*' may be formed integrally as a monolithic or one-piece structure.

Figure 6:
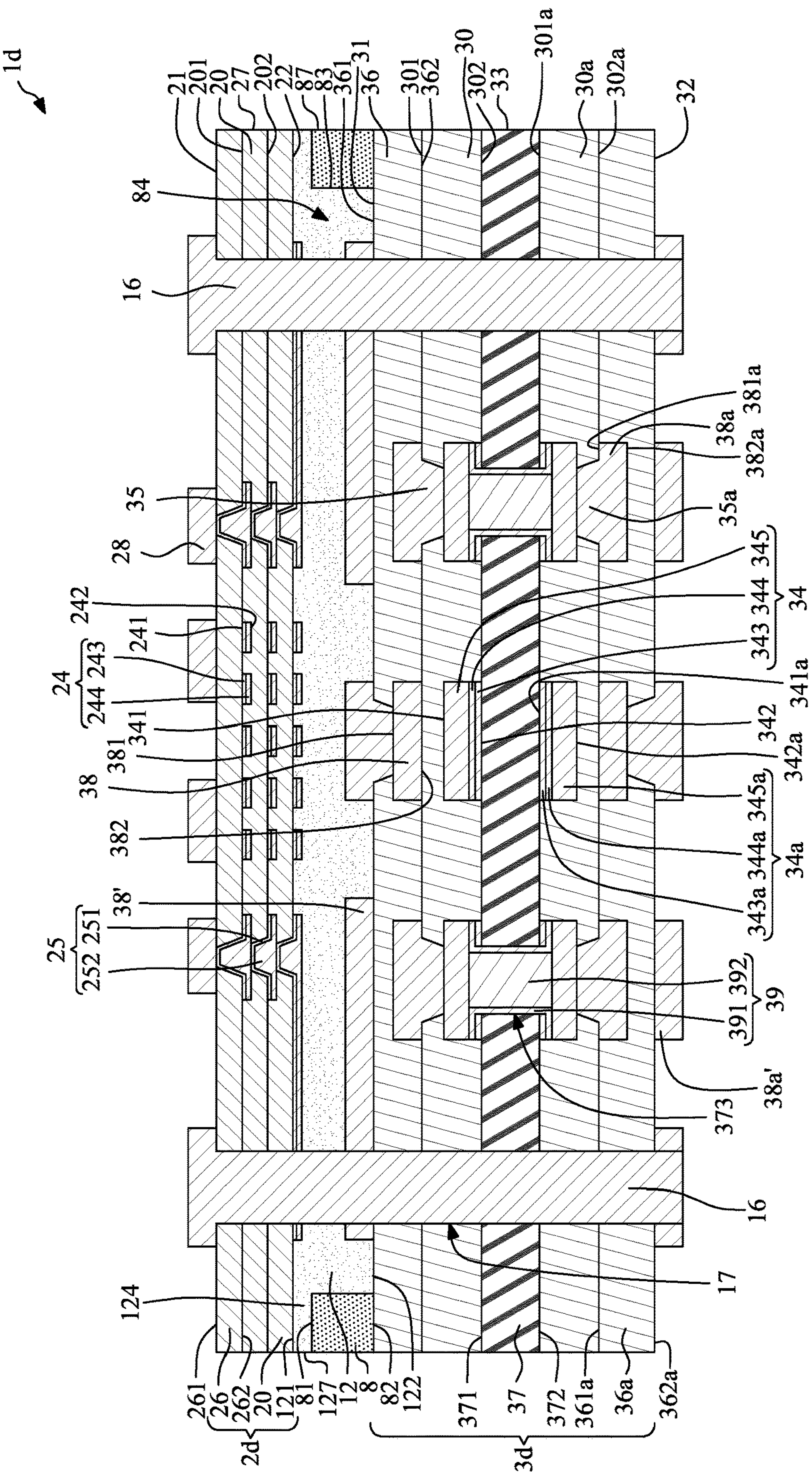
FIG. 6 illustrates a cross-sectional view of a wiring structure according to some embodiments of the present disclosure.

FIG. 6 illustrates a cross-sectional view of a wiring structure 1*d* according to some embodiments of the present disclosure. The wiring structure 1*d* is similar to the wiring structure 1 shown in FIG. 1, except for structures of the upper conductive structure 2*d* and the lower conductive structure 3*d*. In addition, the upper through via 14 is replaced by at least one penetrating via (or through via) 16. As shown in FIG. 6, the wiring structure 1*d* defines at least one through hole 17 extending through the upper conductive structure 2*d*, the adhesion layer 12 and the lower conductive structure 3*d*. A maximum width of the through hole 17 may be about 100 μm to about 1000 μm. In some embodiments, the through hole 17 may be formed by mechanical drilling. Thus, the through hole 17 may not taper. The penetrating via 16 is formed or disposed in the corresponding through hole 17, and is formed of a metal, a metal alloy, or other conductive material. Thus, the penetrating via 16 extends through the upper conductive structure 2*d*, the adhesion layer 12 and the lower conductive structure 3*d*. As shown in FIG. 6, the penetrating via 16 extends through and contacts the bottommost first circuit layer 24 of the upper conductive structure 2*d*, the topmost circuit layer (e.g., the second upper circuit layer 38') of the lower conductive structure 3*d*, and the bottommost circuit layer (e.g., the second lower circuit layer 38*a*') of the lower conductive structure 3*d*. In some embodiments, the penetrating via 16 is a monolithic structure or one-piece structure having a homogeneous material composition. In some embodiments, the penetrating via 16 and the second circuit layer 28 may be formed integrally.

Figure 7:
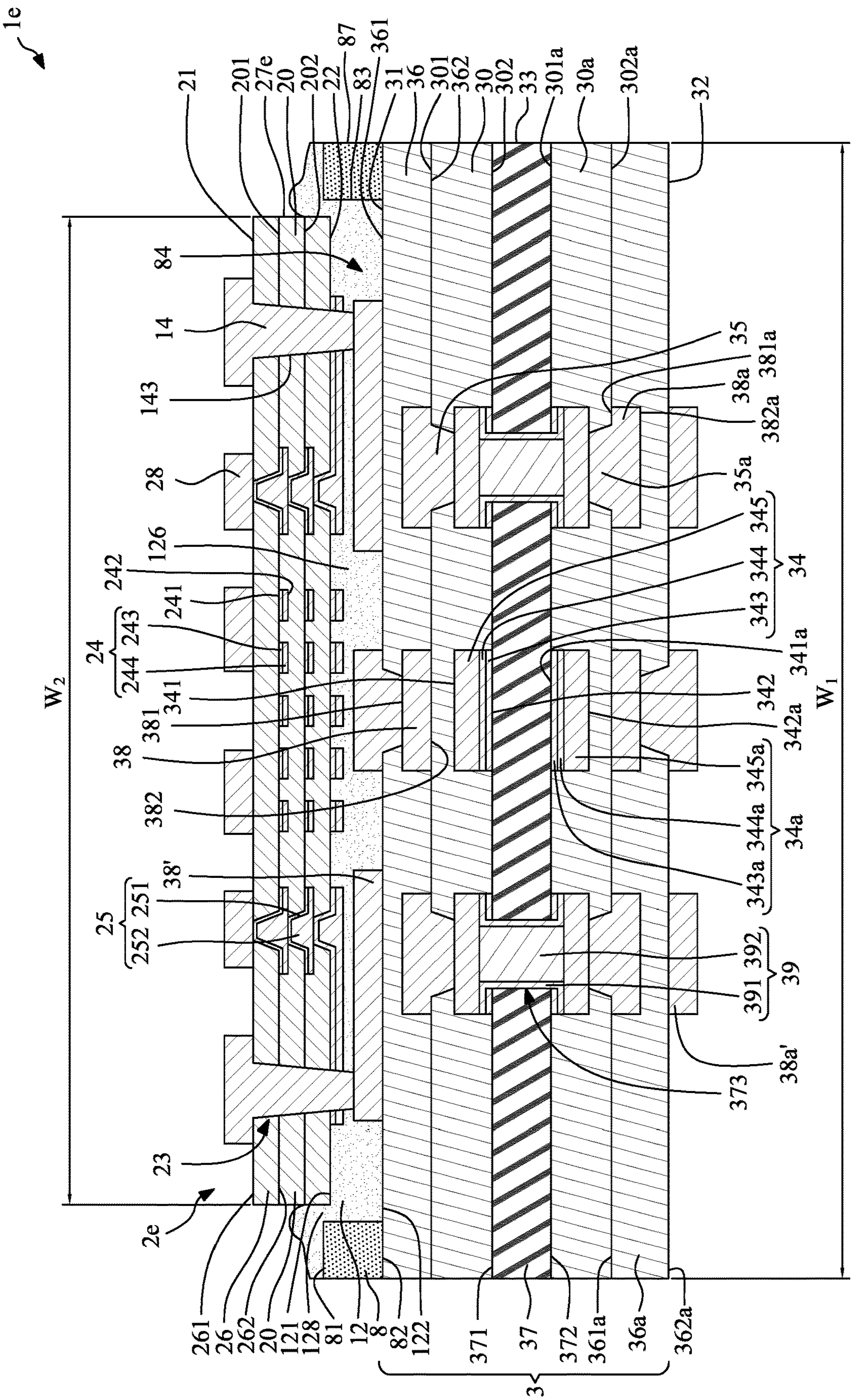
FIG. 7 illustrates a cross-sectional view of a wiring structure according to some embodiments of the present disclosure.

FIG. 7 illustrates a cross-sectional view of a wiring structure 1*e* according to some embodiments of the present disclosure. The wiring structure 1*e* is similar to the wiring structure 1 shown in FIG. 1, except for a structure of the upper conductive structure 2*e*. As shown in FIG. 7, a width $W_2$ of the upper conductive structure 2*e* (or the second conductive structure) is less than a width $W_1$ of the lower conductive structure 3 (or the first conductive structure). Thus, a lateral peripheral surface 27*e* of the upper conductive structure 2*e* is not substantially coplanar with (e.g., is inwardly recessed from or otherwise displaced from) the lateral peripheral surface 87 of the dent structure 8 and the lateral peripheral surface 33 of the lower conductive structure 3. In addition, the width $W_2$ of the upper conductive structure 2*e* (or the second conductive structure) may be less than the width $W_3$ of the central cavity 84 of the dent structure 8. In some embodiments, the upper conductive structure 2*e* (or the second conductive structure) is attached to a central portion 126 of the adhesion layer 12 in the central cavity 84 of the dent structure 8. Further, a periphery portion 128 of the adhesion layer 12 may be disposed in the gap between the lateral peripheral surface 27*e* of the upper conductive structure 2*e* (or the second conductive structure) and the inner surface 83 of the dent structure 8. That is, the upper conductive structure 2*e* (or the second conductive structure) may be disposed within the central cavity 84 of the dent structure 8, and a portion (e.g., a periphery portion 128) of the adhesion layer 12 may contact the lateral peripheral surface 27*e* of the upper conductive structure 2*e* (or the second conductive structure). The bottom surface 22 of the upper conductive structure 2*e* (or the second conductive structure) may be lower than the top surface 81 of the dent structure 8.

Figure 8:
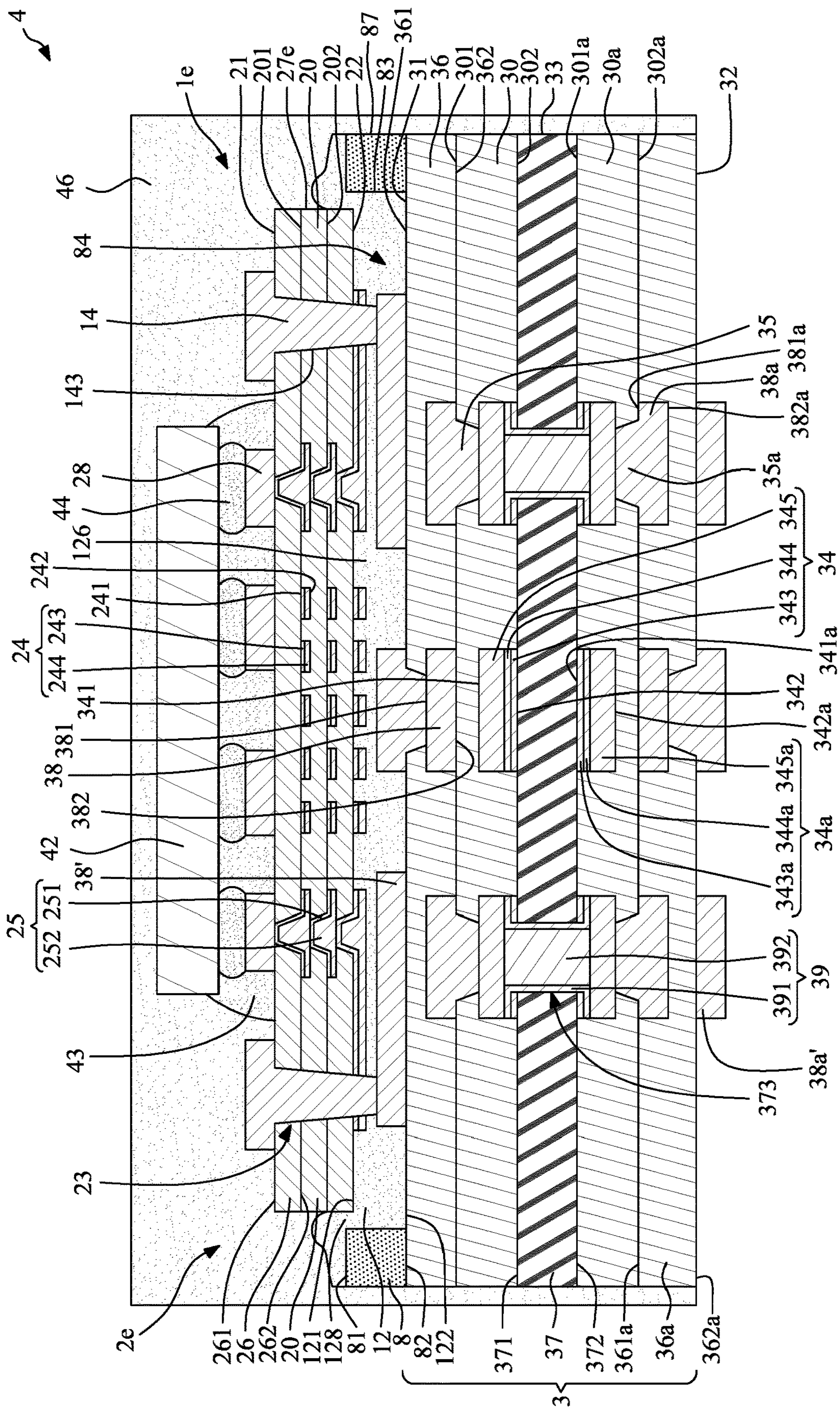
FIG. 8 illustrates a cross-sectional view of a package structure according to some embodiments of the present disclosure.

FIG. 8 illustrates a cross-sectional view of a package structure 4 according to some embodiments of the present disclosure. The package structure 4 includes a wiring structure 1*e*, a semiconductor chip 42, a plurality of connecting elements 44, an underfill 43 and an encapsulant 46. The wiring structure 1*e* of FIG. 8 is similar to the wiring structure 1*e* shown in FIG. 1. The semiconductor chip 42 is electrically connected and bonded to the second circuit layer 28 of the upper conductive structure 2*e* through the connecting elements 44 (e.g., solder bumps or other conductive bumps). The underfill 43 may be disposed between the wiring structure 1*e* and the semiconductor chip 42 to cover and protect the connecting elements 44 and the second circuit layer 28. The encapsulant 46 (e.g., molding compound) may cover the wiring structure 1*e*, semiconductor chip 42 and the underfill 43. In some embodiments, the encapsulant 46 may further cover the periphery portion 128 of the adhesion layer 12, the lateral peripheral surface 87 of the dent structure 8 and the lateral peripheral surface 33 of the lower conductive structure 3.

FIG. 9 through FIG. 33 illustrate a method for manufacturing a wiring structure according to some embodiments of the present disclosure. In some embodiments, the method is for manufacturing the wiring structure 1 shown in FIG. 1.

Figure 9:
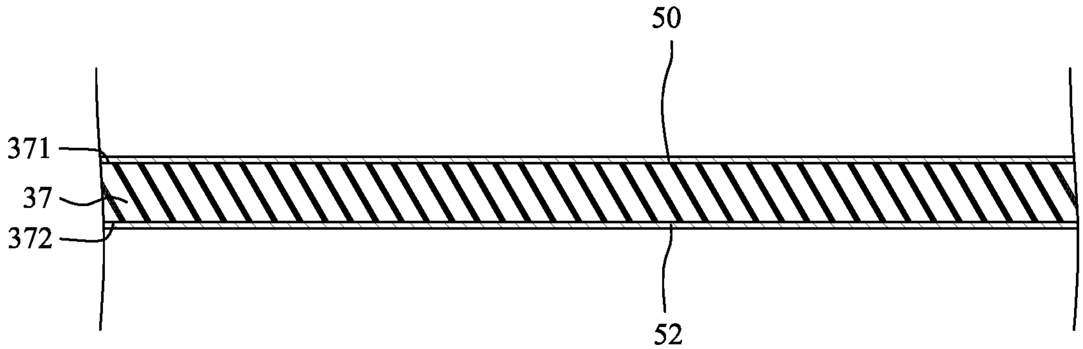
FIG. 9 illustrates one or more stages of an example of a method for manufacturing a wiring structure according to some embodiments of the present disclosure.

Referring to FIG. 9 through FIG. 18, a lower conductive structure 3 (or a first conductive structurer) is provided. The lower conductive structure 3 is manufactured as follows. Referring to FIG. 9, a core portion 37 with a top copper foil 50 and a bottom copper foil 52 is provided. The core portion 37 may be in a wafer type, a panel type or a strip type. The core portion 37 has a top surface 371 and a bottom surface 372 opposite to the top surface 371. The top copper foil 50 is disposed on the top surface 371 of the core portion 37, and the bottom copper foil 52 is disposed on the bottom surface 372 of the core portion 37.

Figure 10:
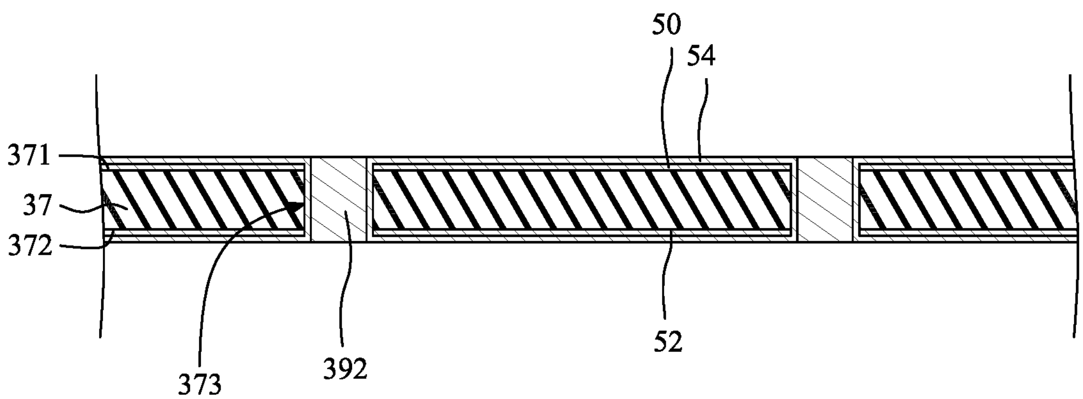
FIG. 10 illustrates one or more stages of an example of a method for manufacturing a wiring structure according to some embodiments of the present disclosure.

Referring to FIG. 10, a plurality of through holes 373 are formed to extend through the core portion 37, the top copper foil 50 and the bottom copper foil 52 by a drilling technique (such as laser drilling or mechanical drilling) or other suitable techniques. Then, a second metallic layer 54 is formed or disposed on the top copper foil 50, the bottom copper foil 52 and side walls of the first through holes 373 by a plating technique or other suitable techniques. A portion of the second metallic layer 54 on the side wall of each first through hole 373 defines a central through hole. Then, an insulation material 392 is disposed to fill the central through hole defined by the second metallic layer 54.

Figure 11:
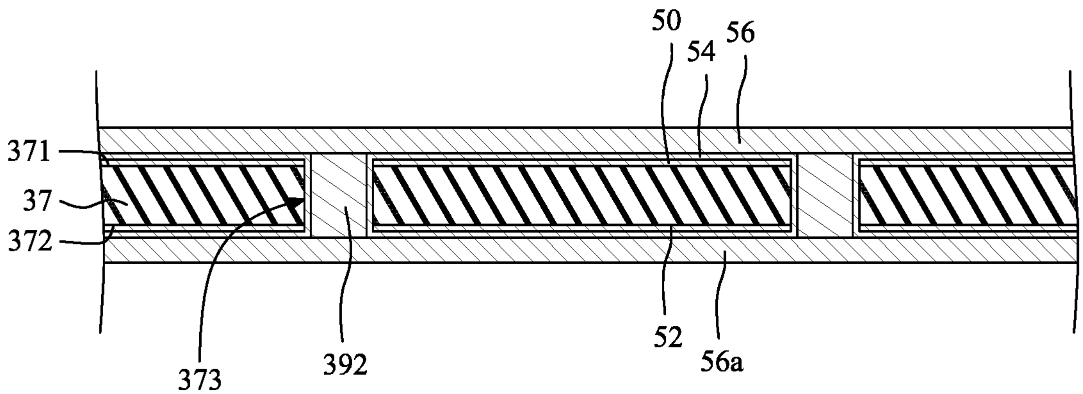
FIG. 11 illustrates one or more stages of an example of a method for manufacturing a wiring structure according to some embodiments of the present disclosure.

Referring to FIG. 11, a top third metallic layer 56 and a bottom third metallic layer 56*a* are formed or disposed on the second metallic layer 54 by a plating technique or other suitable techniques. The third metallic layers 56, 56*a* cover the insulation material 392.

Figure 12:
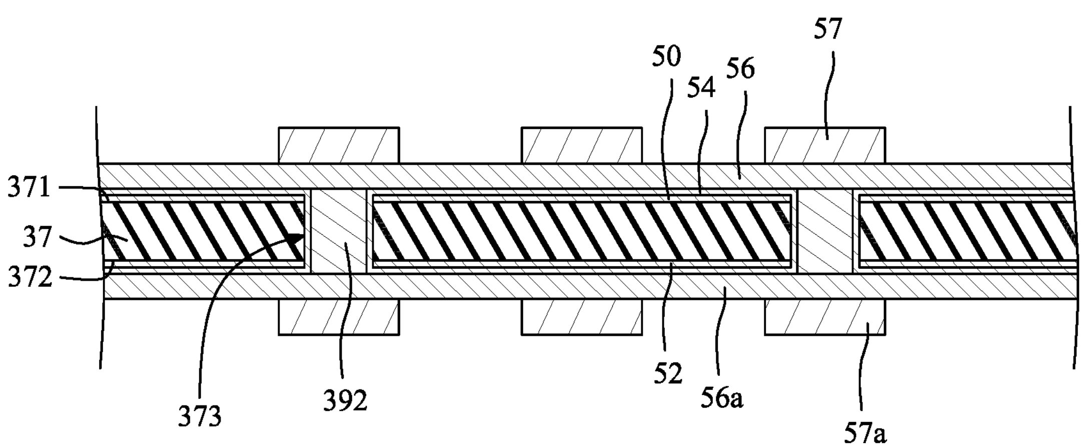
FIG. 12 illustrates one or more stages of an example of a method for manufacturing a wiring structure according to some embodiments of the present disclosure.

Referring to FIG. 12, a top photoresist layer 57 is formed or disposed on the top third metallic layer 56, and a bottom photoresist layer 57*a* is formed or disposed on the bottom third metallic layer 56*a*. Then, the photoresist layers 57, 57*a* are patterned by exposure and development.

Figure 13:
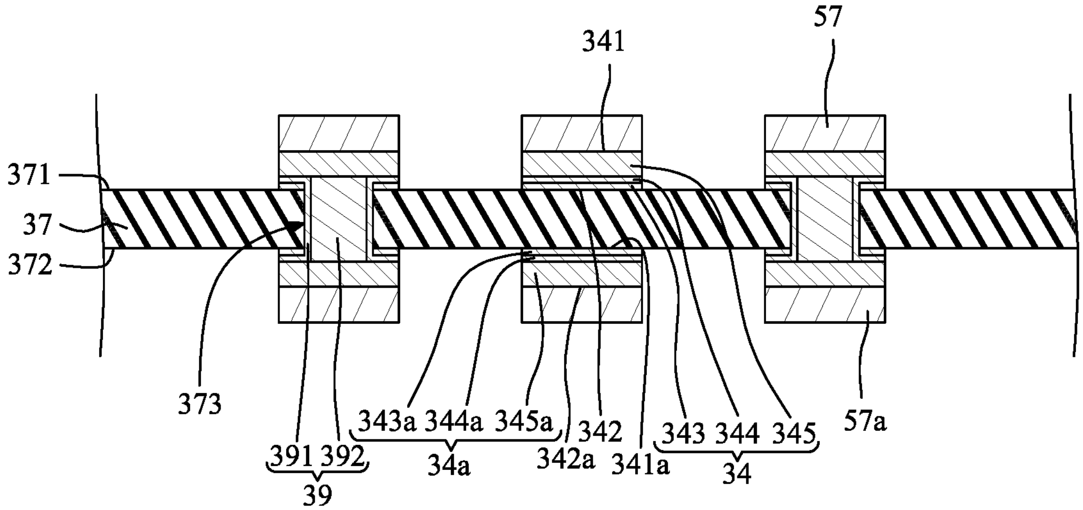
FIG. 13 illustrates one or more stages of an example of a method for manufacturing a wiring structure according to some embodiments of the present disclosure.

Referring to FIG. 13, portions of the top copper foil 50, the second metallic layer 54 and the top third metallic layer 56 that are not covered by the top photoresist layer 57 are removed by an etching technique or other suitable techniques. Portions of the top copper foil 50, the second metallic layer 54 and the top third metallic layer 56 that are covered by the top photoresist layer 57 remain to form a first upper circuit layer 34. Meanwhile, portions of the bottom copper foil 52, the second metallic layer 54 and the bottom third metallic layer 56*a* that are not covered by the bottom photoresist layer 57*a* are removed by an etching technique or other suitable techniques. Portions of the bottom copper foil 52, the second metallic layer 54 and the bottom third metallic layer 56*a* that are covered by the bottom photoresist layer 57*a* remain to form a first lower circuit layer 34*a*. Meanwhile, portions of the second metallic layer 54 and the insulation material 392 that are disposed in the through hole 373 form an interconnection via 39.

Figure 14:
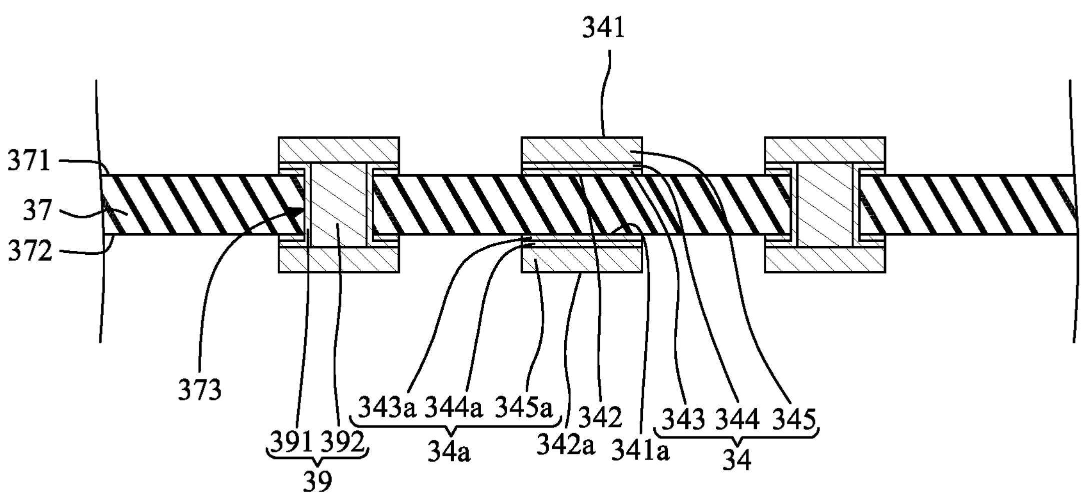
FIG. 14 illustrates one or more stages of an example of a method for manufacturing a wiring structure according to some embodiments of the present disclosure.

Referring to FIG. 14, the top photoresist layer 57 and the bottom photoresist layer 57*a* are removed by a stripping technique or other suitable techniques.

Figure 15:
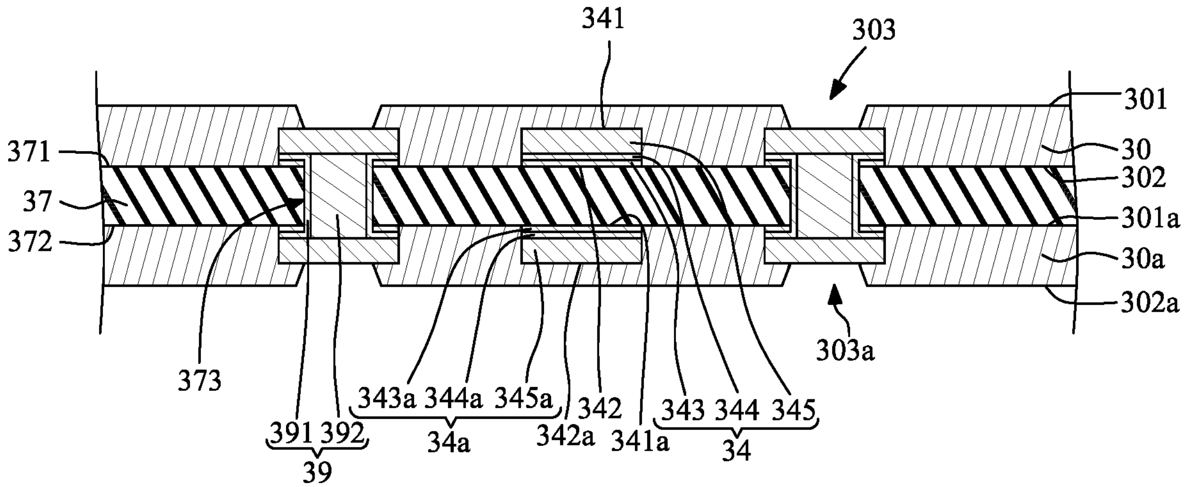
FIG. 15 illustrates one or more stages of an example of a method for manufacturing wiring structure according to some embodiments of the present disclosure.

Referring to FIG. 15, a first upper dielectric layer 30 is formed or disposed on the top surface 371 of the core portion 37 to cover the top surface 371 of the core portion 37 and the first upper circuit layer 34 by a lamination technique or other suitable techniques. Meanwhile, a first lower dielectric layer 30*a* is formed or disposed on the bottom surface 372 of the core portion 37 to cover the bottom surface 372 of the core portion 37 and the first lower circuit layer 34*a* by a lamination technique or other suitable techniques. Then, at least one through hole 303 is formed to extend through the first upper dielectric layer 30 to expose a portion of the first upper circuit layer 34 by a drilling technique or other suitable techniques. Meanwhile, at least one through hole 303*a* is formed to extend through the first lower dielectric layer 30*a* to expose a portion of the first lower circuit layer 34*a* by a drilling technique or other suitable techniques.

Figure 16:
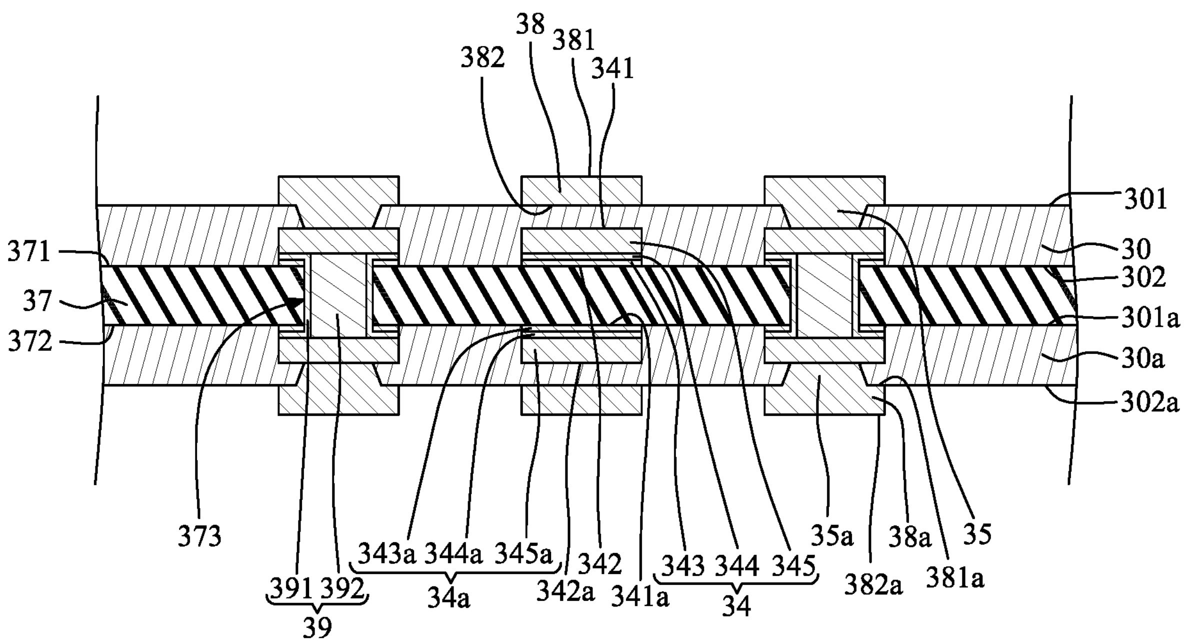
FIG. 16 illustrates one or more stages of an example of a method for manufacturing a wiring structure according to some embodiments of the present disclosure.

Referring to FIG. 16, a second upper circuit layer 38 is formed on the first upper dielectric layer 30, and an upper interconnection via 35 is formed in the through hole 303. Meanwhile, a second lower circuit layer 38*a* is formed on the first lower dielectric layer 30*a*, and a lower interconnection via 35*a* is formed in the through hole 303*a*.

Figure 17:
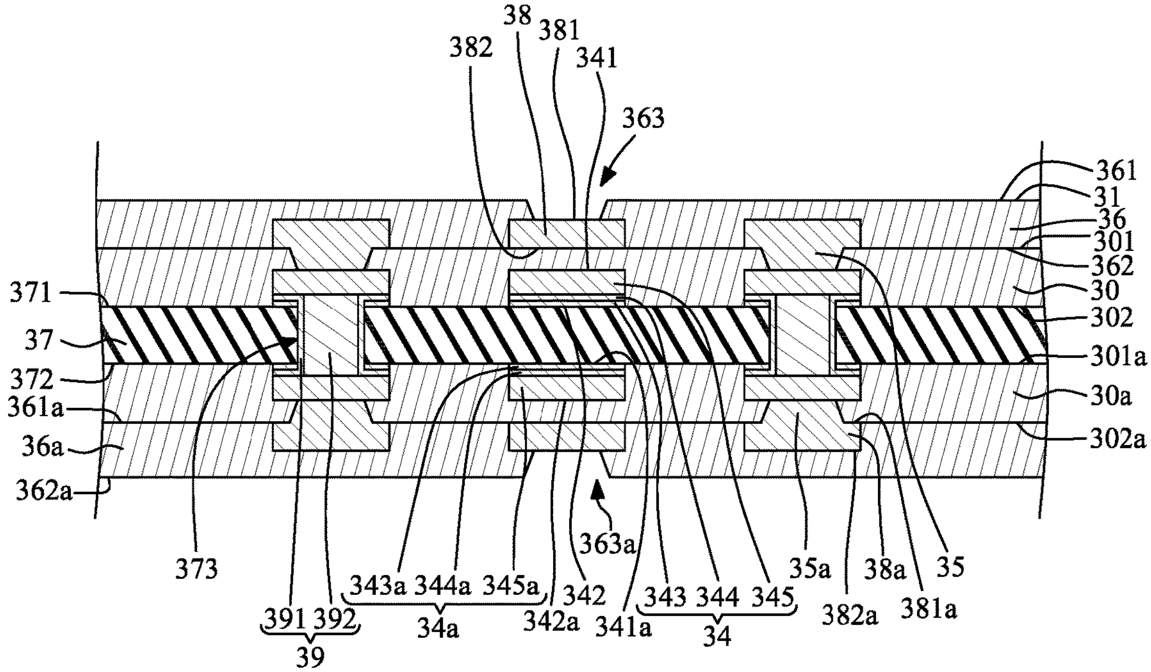
FIG. 17 illustrates one or more stages of an example of a method for manufacturing a wiring structure according to some embodiments of the present disclosure.

Referring to FIG. 17, a second upper dielectric layer 36 is formed or disposed on the first upper dielectric layer 30 to cover the top surface 301 of the first upper dielectric layer 30 and the second upper circuit layer 38 by a lamination technique or other suitable techniques. Meanwhile, a second lower dielectric layer 36*a* is formed or disposed on the first lower dielectric layer 30*a* to cover the bottom surface 302*a* of the first lower dielectric layer 30*a* and the second lower circuit layer 38*a* by a lamination technique or other suitable techniques. Then, at least one through hole 363 is formed to extend through the second upper dielectric layer 36 to expose a portion of the second upper circuit layer 38 by a drilling technique or other suitable techniques. Meanwhile, at least one through hole 363*a* is formed to extend through the second lower dielectric layer 36*a* to expose a portion of the second lower circuit layer 38*a* by a drilling technique or other suitable techniques.

Figure 18:
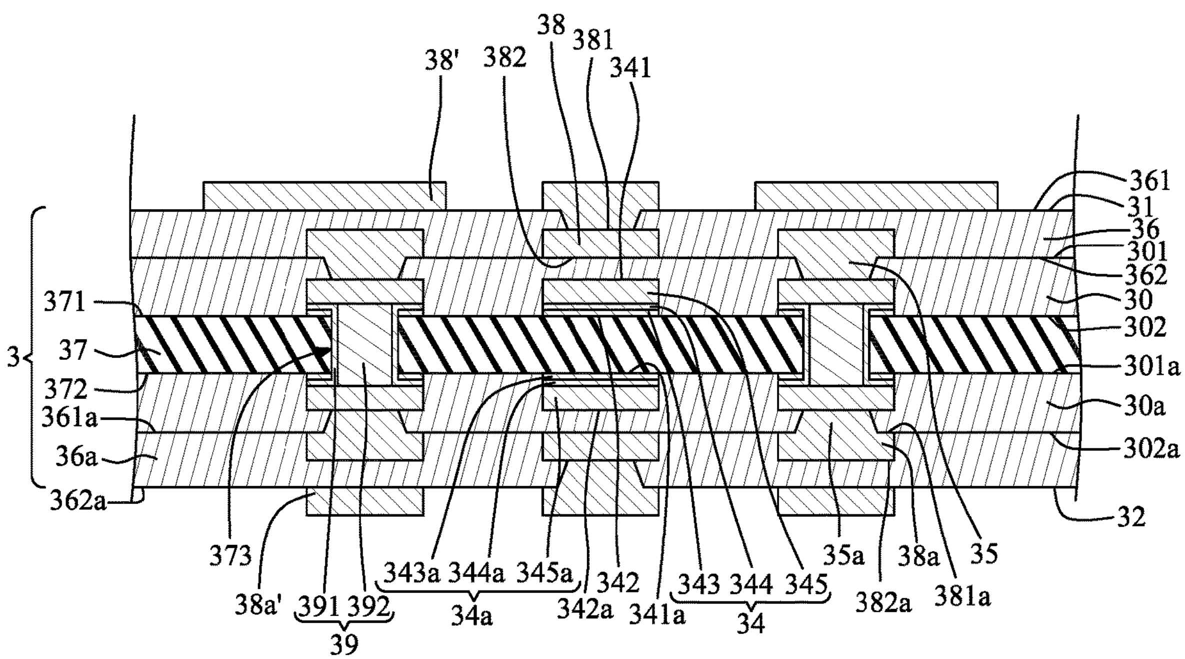
FIG. 18 illustrates one or more stages of an example of a method for manufacturing a wiring structure according to some embodiments of the present disclosure.

Referring to FIG. 18, a second upper circuit layer 38' is formed on the second upper dielectric layer 36, and an upper interconnection via 35 is formed in the through hole 363. Meanwhile, a second lower circuit layer 38*a'* is formed on the second lower dielectric layer 36*a*, and a lower interconnection via 35*a* is formed in the through hole 363*a*.

Meanwhile, the lower conductive structure 3 is formed, and the dielectric layers (including, the first upper dielectric layer 30, the second upper dielectric layer 36, the first lower dielectric layer 30*a* and the second lower dielectric layer 36*a*) are cured. The lower conductive structure 3 may be a wafer structure, a strip structure or a panel structure. Then, an electrical property (such as open circuit/short circuit) of the lower conductive structure 3 is tested.

Figure 19:
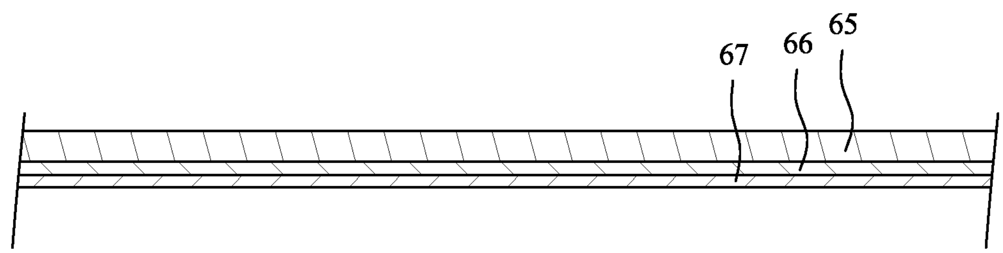
FIG. 19 illustrates one or more stages of an example of a method for manufacturing a wiring structure according to some embodiments of the present disclosure.

Referring to FIG. 19 through FIG. 25, an upper conductive structure 2 (or a second conductive structure) is provided. The upper conductive structure 2 is manufactured as follows. Referring to FIG. 19, a carrier 65 is provided. The carrier 65 may be a glass carrier, and may be in a wafer type, a panel type or a strip type. Then, a release layer 66 is coated on a bottom surface of the carrier 65. Then, a conductive layer 67 (e.g., a seed layer) is formed or disposed on the release layer 66 by a physical vapor deposition (PVD) technique or other suitable techniques.

Figure 20:
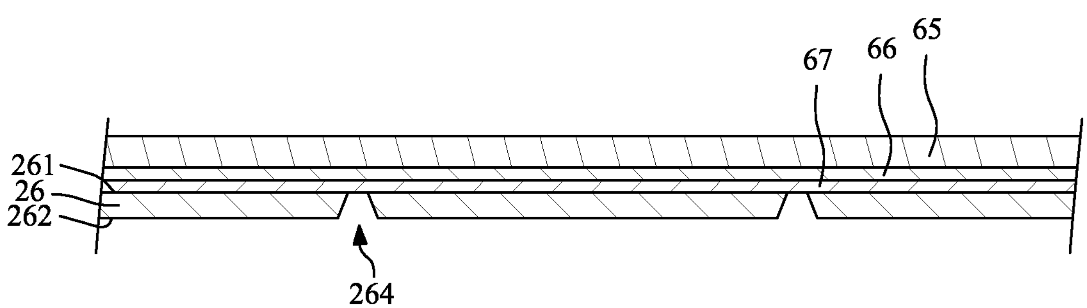
FIG. 20 illustrates one or more stages of an example of a method for manufacturing a wiring structure according to some embodiments of the present disclosure.

Referring to FIG. 20, a second dielectric layer 26 is formed on the conductive layer 67 by a coating technique or other suitable techniques. Then, at least one through hole 264 is formed to extend through the second dielectric layer 26 to expose a portion of the conductive layer 67 by an exposure and development technique or other suitable techniques.

Figure 21:
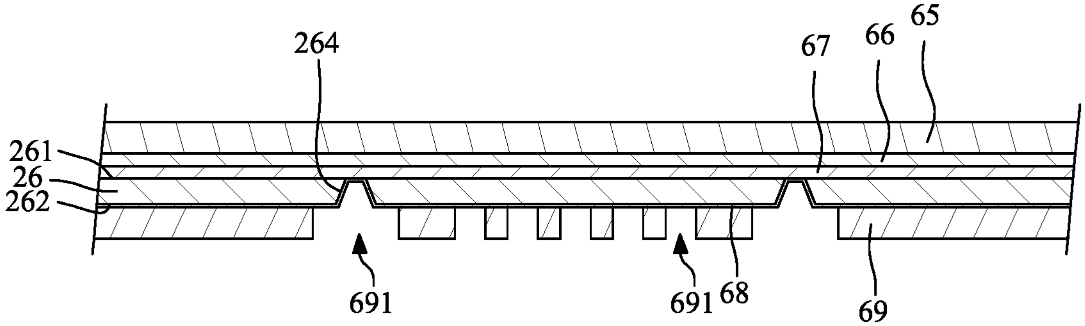
FIG. 21 illustrates one or more stages of an example of a method for manufacturing a wiring structure according to some embodiments of the present disclosure.

Referring to FIG. 21, a seed layer 68 is formed on a bottom surface 262 of the second dielectric layer 26 and in the through hole 264 by a PVD technique or other suitable techniques. Then, a photoresist layer 69 is formed on the seed layer 68. Then, the photoresist layer 69 is patterned to expose portions of the seed layer 68 by an exposure and development technique or other suitable techniques. The photoresist layer 69 defines a plurality of openings 691. At least one opening 691 of the photoresist layer 69 corresponds to, and is aligned with, the through hole 264 of the second dielectric layer 26.

Figure 22:
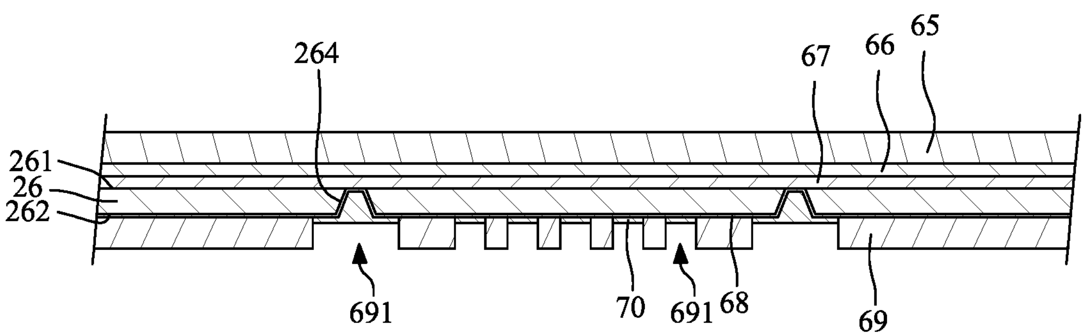
FIG. 22 illustrates one or more stages of an example of a method for manufacturing a wiring structure according to some embodiments of the present disclosure.

Referring to FIG. 22, a conductive material 70 (e.g., a metallic material) is disposed in the openings 691 of the photoresist layer 69 and on the seed layer 68 by a plating technique or other suitable techniques.

Figure 23:
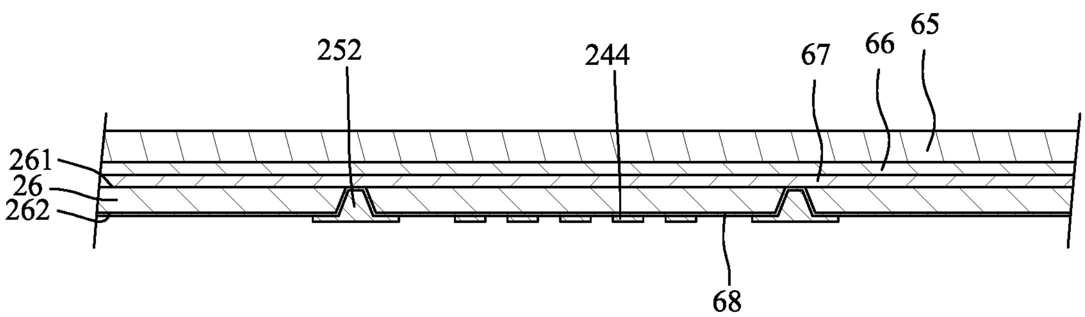
FIG. 23 illustrates one or more stages of an example of a method for manufacturing a wiring structure according to some embodiments of the present disclosure.

Referring to FIG. 23, the photoresist layer 69 is removed by a stripping technique or other suitable techniques.

Figure 24:
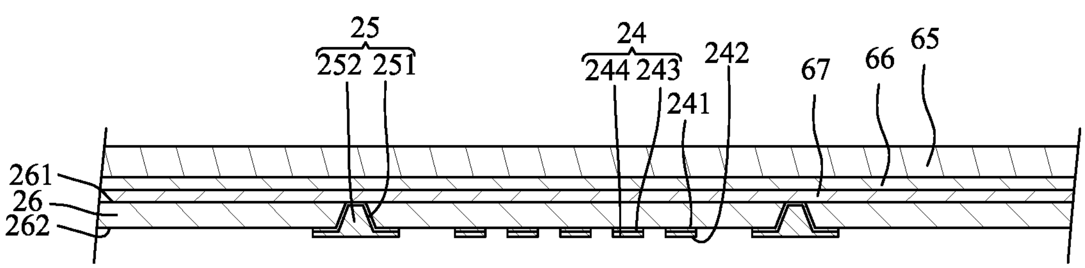
FIG. 24 illustrates one or more stages of an example of a method for manufacturing a wiring structure according to some embodiments of the present disclosure.

Referring to FIG. 24, portions of the seed layer 68 that are not covered by the conductive material 70 are removed by an etching technique or other suitable techniques. Meanwhile, a circuit layer 24 and at least one inner via 25 are formed.

Figure 25:
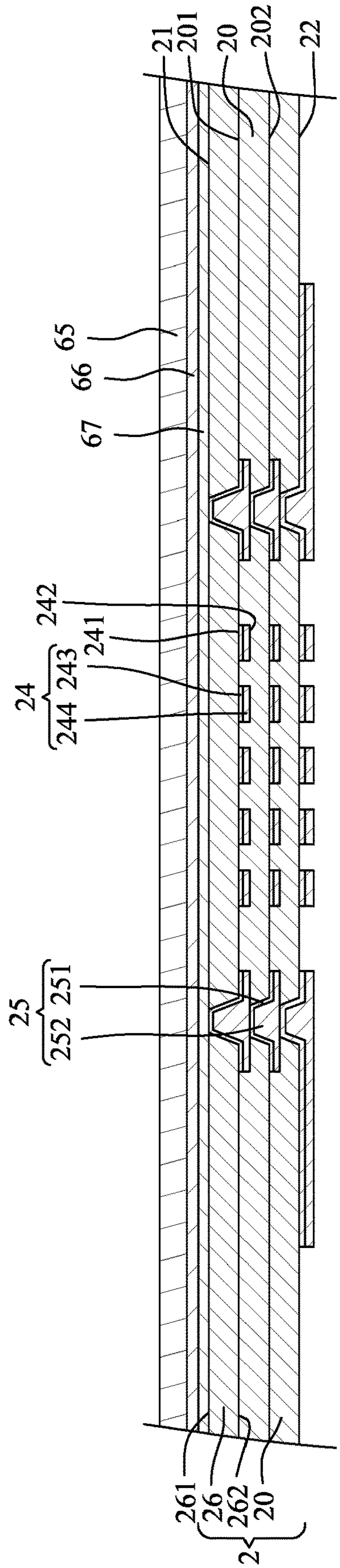
FIG. 25 illustrates one or more stages of an example of a method for manufacturing a wiring structure according to some embodiments of the present disclosure.

Referring to FIG. 25, a plurality of first dielectric layers 20 and a plurality of first circuit layers 24 are formed by repeating the stages of FIG. 20 to FIG. 24. Meanwhile, the upper conductive structure 2 is formed, and the dielectric layers (including, the first dielectric layers 20 and the second dielectric layer 26) are cured. Then, an electrical property (such as open circuit/short circuit) of the upper conductive structure 2 is tested.

Figure 26:
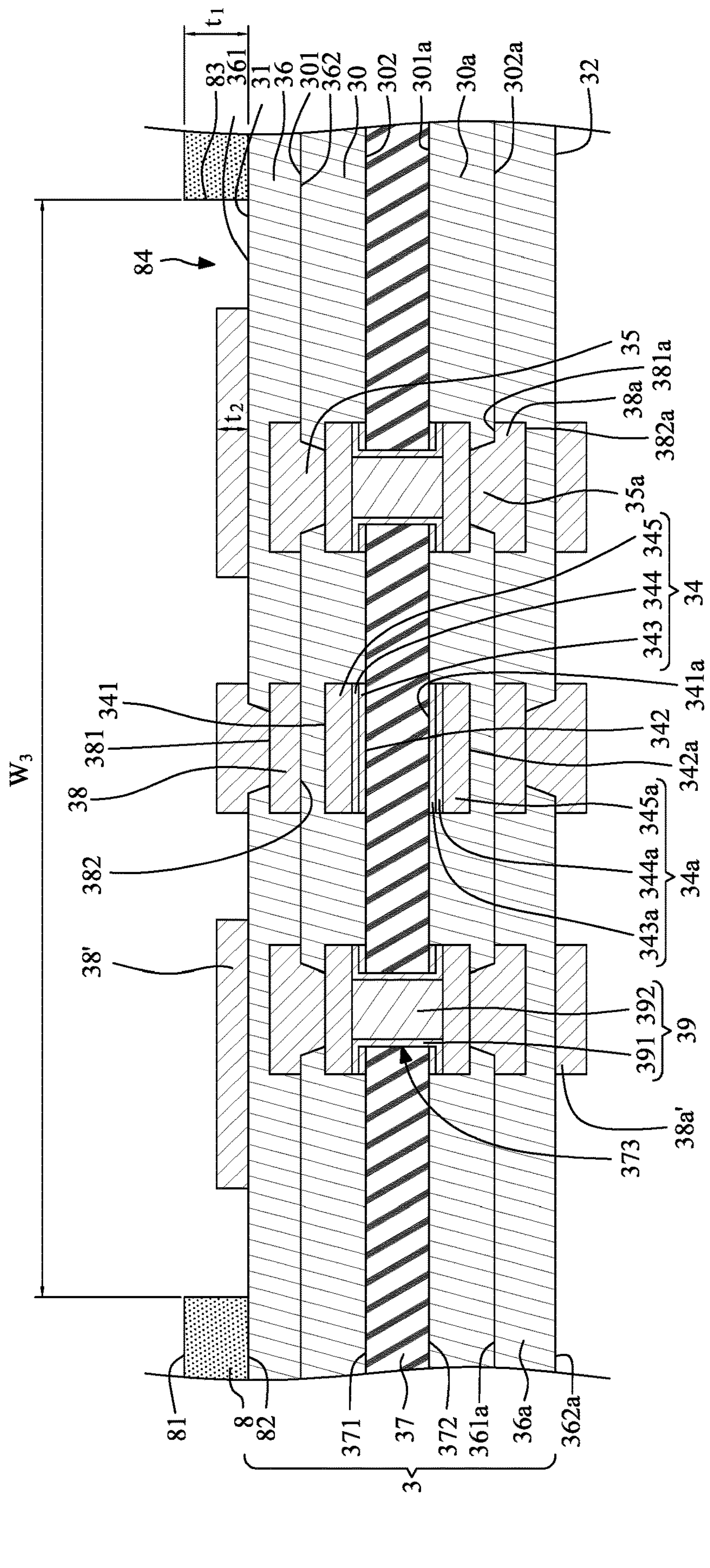
FIG. 26 illustrates one or more stages of an example of a method for manufacturing a wiring structure according to some embodiments of the present disclosure.

Referring to FIG. 26, a dent structure 8 is formed or disposed on the lower conductive structure 3 (or the first conductive structure). The dent structure 8 may have a top surface 81, a bottom surface 82 opposite to the top surface 81, and an inner surface 83 extending between the top surface 81 and the bottom surface 82. The dent structure 8 has a thickness $t_1$. The bottom surface 82 of the dent structure 8 is disposed on and contacts the top surface 31 of the lower conductive structure 3 (or the first conductive structure) directly. The dent structure 8 may be a ring structure, and the inner surface 83 of the dent structure 8 and the top surface 31 of the lower conductive structure 3 (or the first conductive structure) may jointly define a central cavity 84. In some embodiments, the thickness $t_1$ of the dent structure 8 may be greater than or equal to a thickness t2 of the topmost circuit layer 38' of the lower conductive structure 3 (or the first conductive structure).

Figure 27:
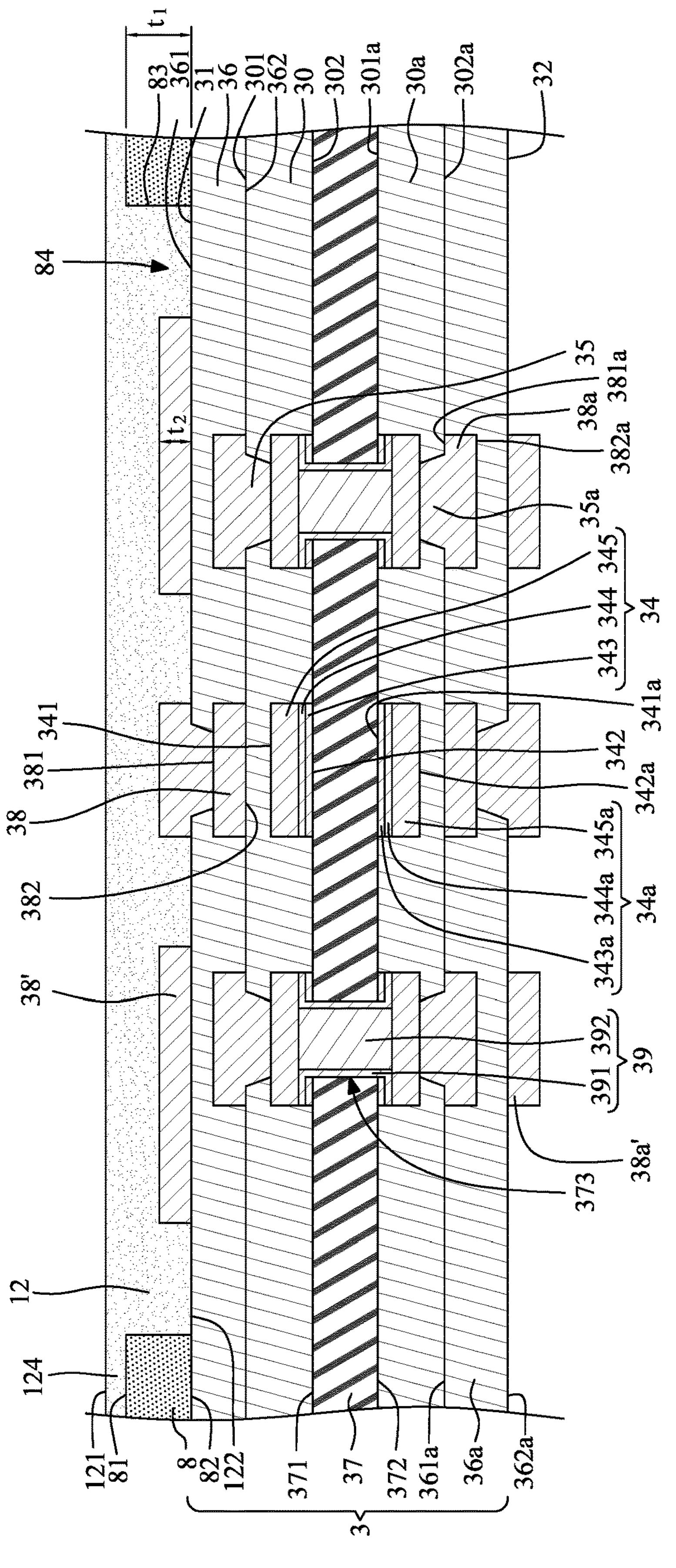
FIG. 27 illustrates one or more stages of an example of a method for manufacturing a wiring structure according to some embodiments of the present disclosure.

Referring to FIG. 27, an adhesion layer 12 is applied or disposed in the central cavity 84.

Figure 28:
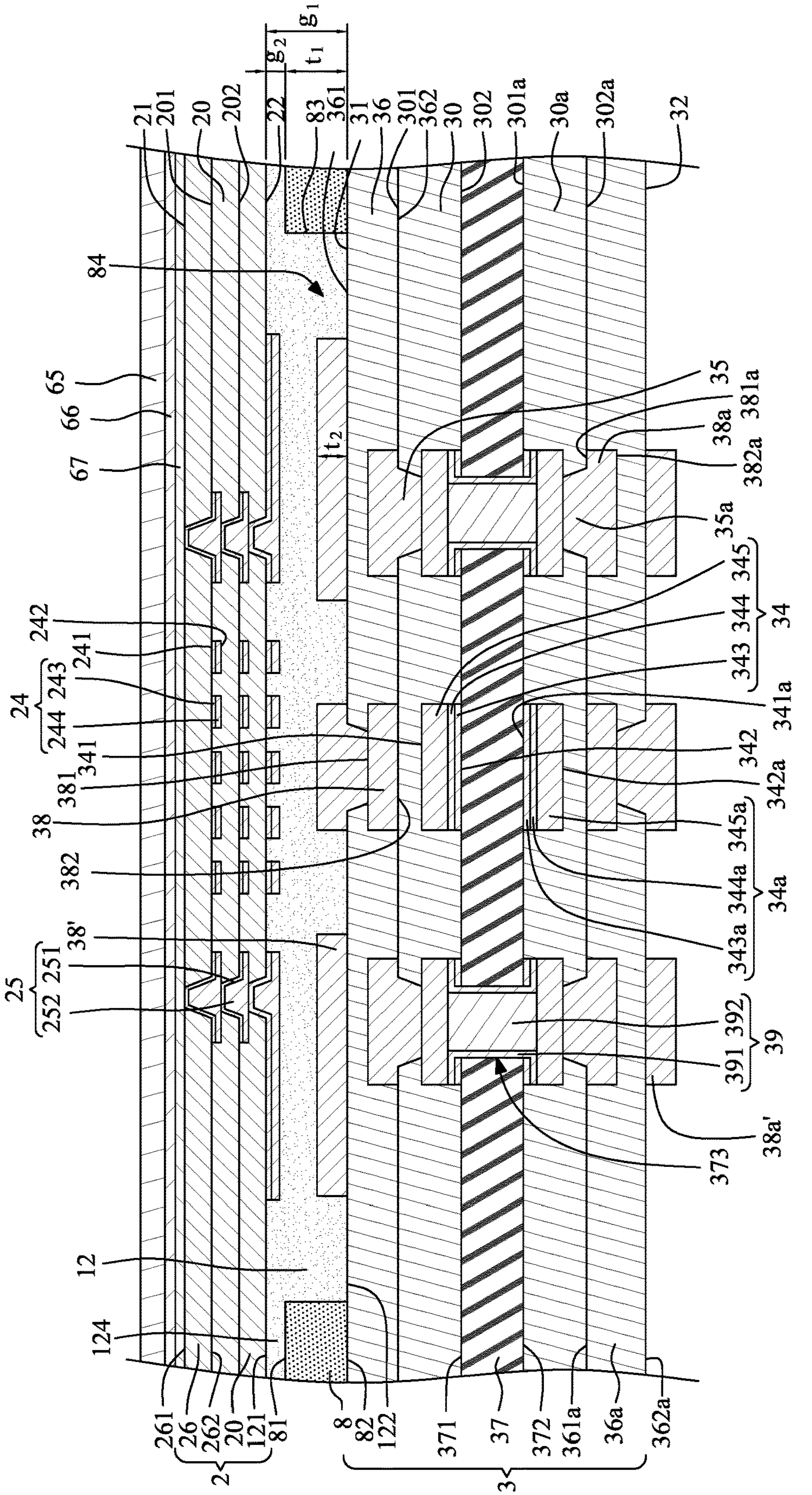
FIG. 28 illustrates one or more stages of an example of a method for manufacturing a wiring structure according to some embodiments of the present disclosure.

Referring to FIG. 28, the upper conductive structure 2 is attached to the lower conductive structure 3 through the adhesion layer 12. Then, the adhesion layer 12 is cured. In some embodiments, the upper conductive structure 2 may be pressed onto the lower conductive structure 3. Thus, the thickness of the intermediate layer 12 is determined by the gap $g_1$ between the upper conductive structure 2 and the lower conductive structure 3. In some embodiments, a periphery portion 124 of the adhesion layer 12 may be disposed in the gap $g_2$ between the bottom surface 22 of the upper conductive structure 2 (or the second conductive structure) and the top surface 81 of the dent structure 8. In some embodiments, as shown in FIG. 1, a width of the upper conductive structure 2 (or the second conductive structure) is substantially equal to or less than a width of the lower conductive structure 3 (or the first conductive structure). In some embodiments, as shown in FIG. 7, a width of the upper conductive structure 2 (or the second conductive structure) is substantially equal to or less than a width of the central cavity 84.

Figure 29:
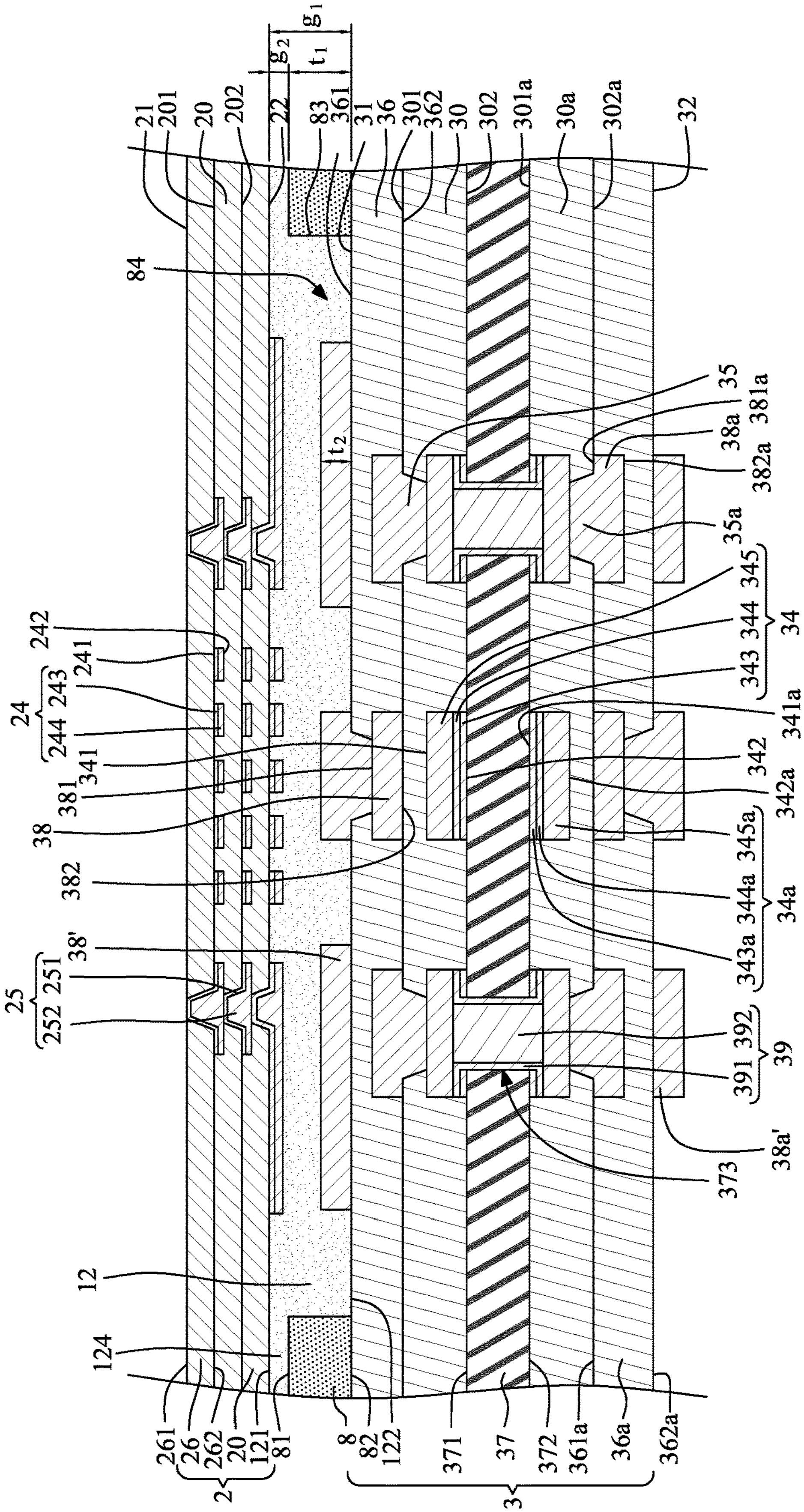
FIG. 29 illustrates one or more stages of an example of a method for manufacturing wiring structure according to some embodiments of the present disclosure.

Referring to FIG. 29, the carrier 65, the release layer 66 and the conductive layer 67 are removed so as to expose a portion of the inner via 25.

Figure 30:
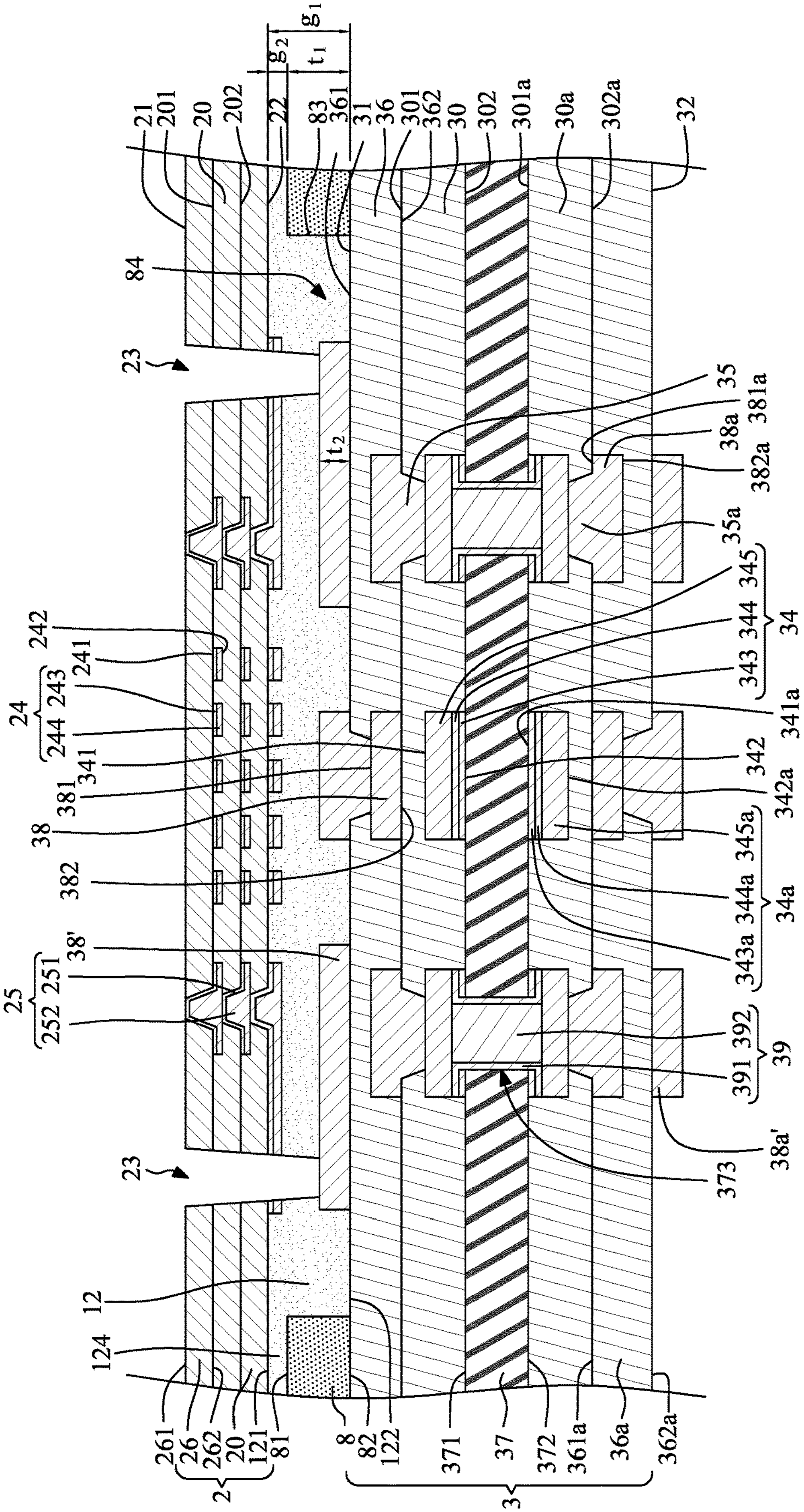
FIG. 30 illustrates one or more stages of an example of a method for manufacturing a wiring structure according to some embodiments of the present disclosure.
Figure 31:
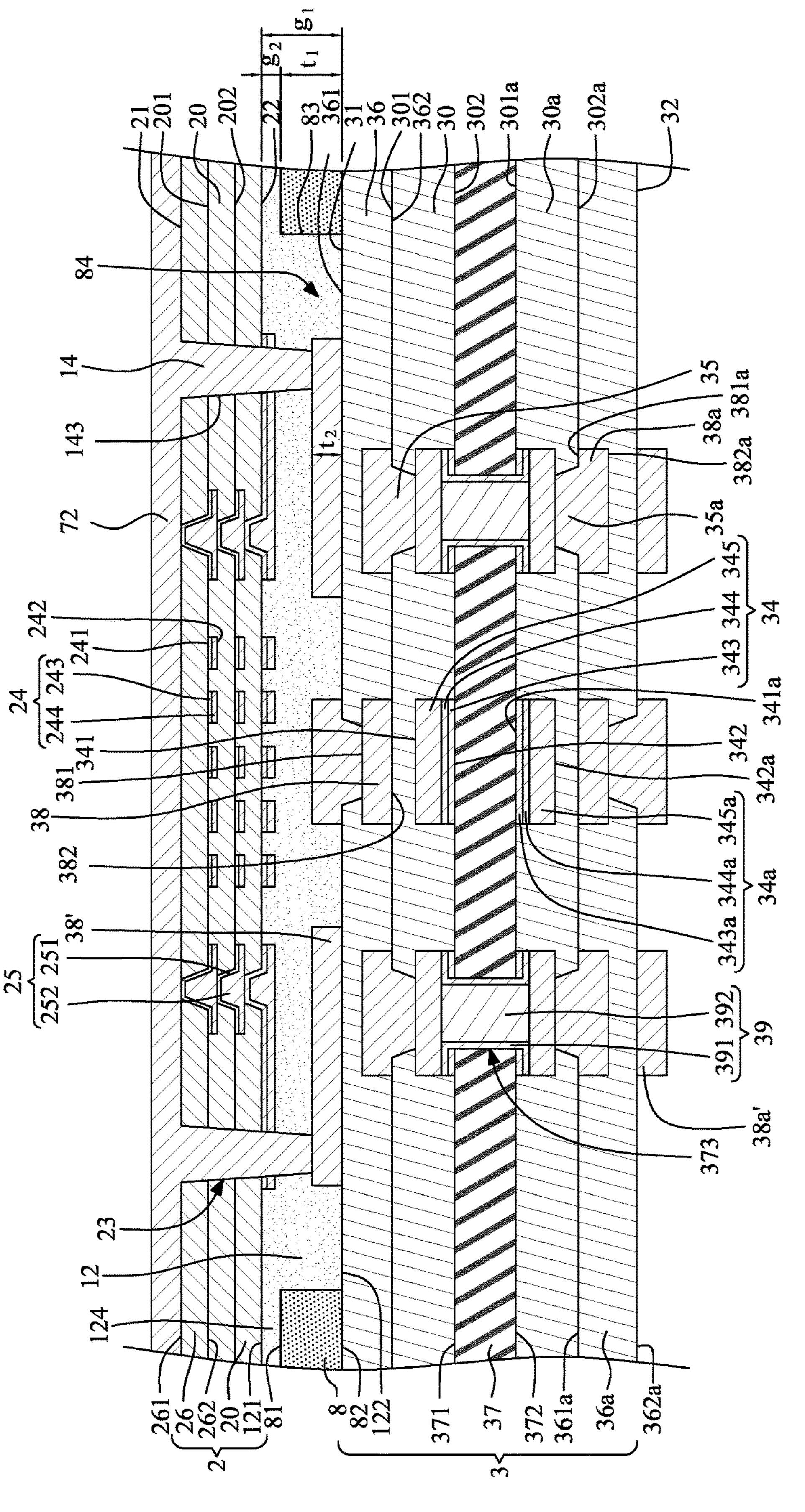

Referring to FIG. 30, at least one through hole 23 is formed to extend through at least a portion of the upper conductive structure 2 and the adhesion layer 12 by drilling (such as laser drilling) to exposes a circuit layer (e.g., second upper circuit layer 38') of the lower conductive structure 3. The through hole 23 tapers downwardly.

Referring to FIG. 3I, a metallic layer 72 is formed on the top surface 21 of the upper conductive structure 2 and in the through hole 23 to form at least one upper through via 14 in the through hole 23 by a plating technique or other suitable techniques. The upper conductive structure 2 (or the second conductive structure) is electrically connected to the lower conductive structure 3 (or the first conductive structure) through the upper through via 14.

Figure 32:
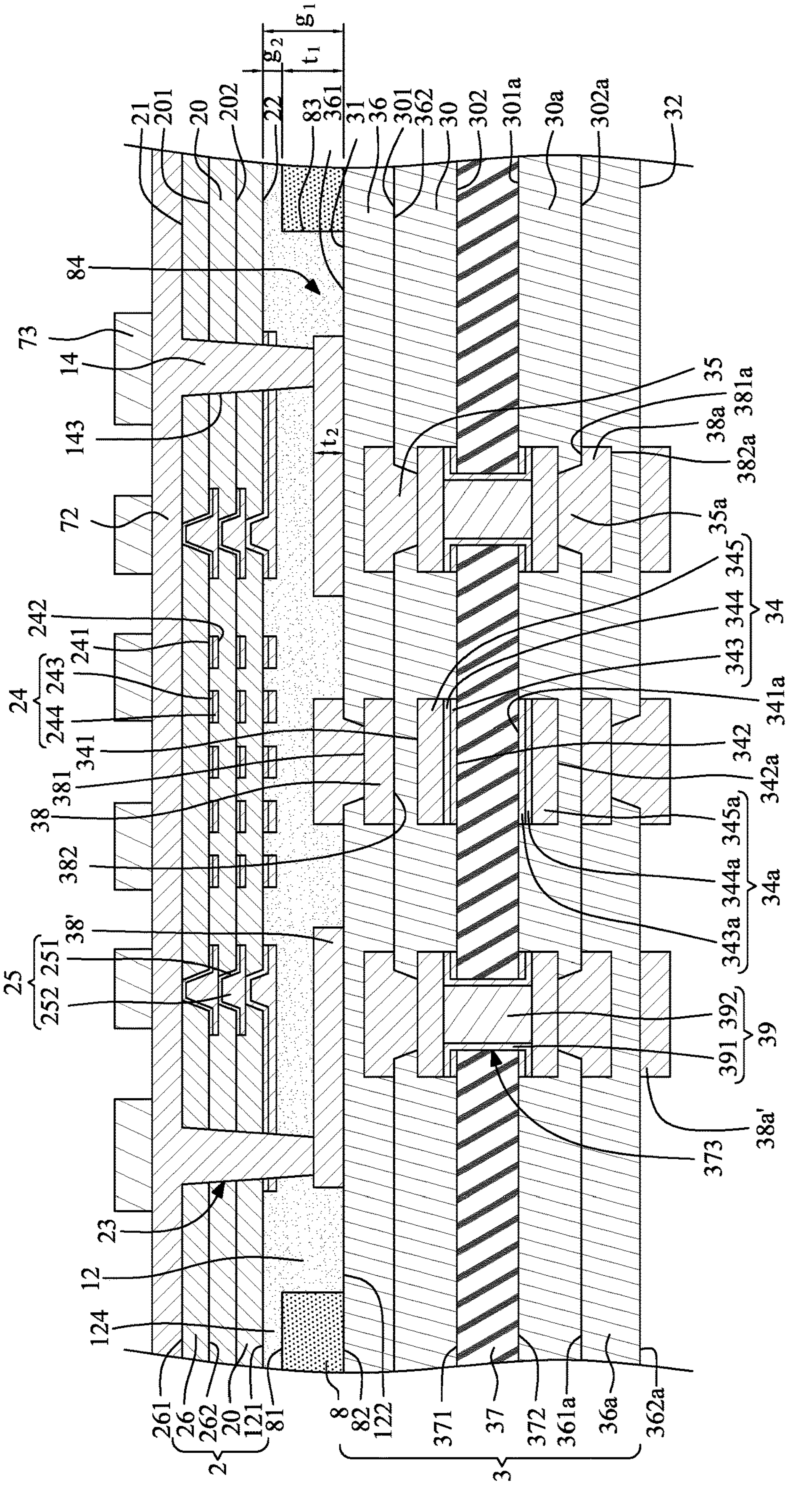
FIG. 32 illustrates one or more stages of an example of a method for manufacturing a wiring structure according to some embodiments of the present disclosure.

Referring to FIG. 32, a top photoresist layer 73 is formed or disposed on the metallic layer 72. Then, the top photoresist layer 73 is patterned by an exposure and development technique or other suitable techniques.

Figure 33:
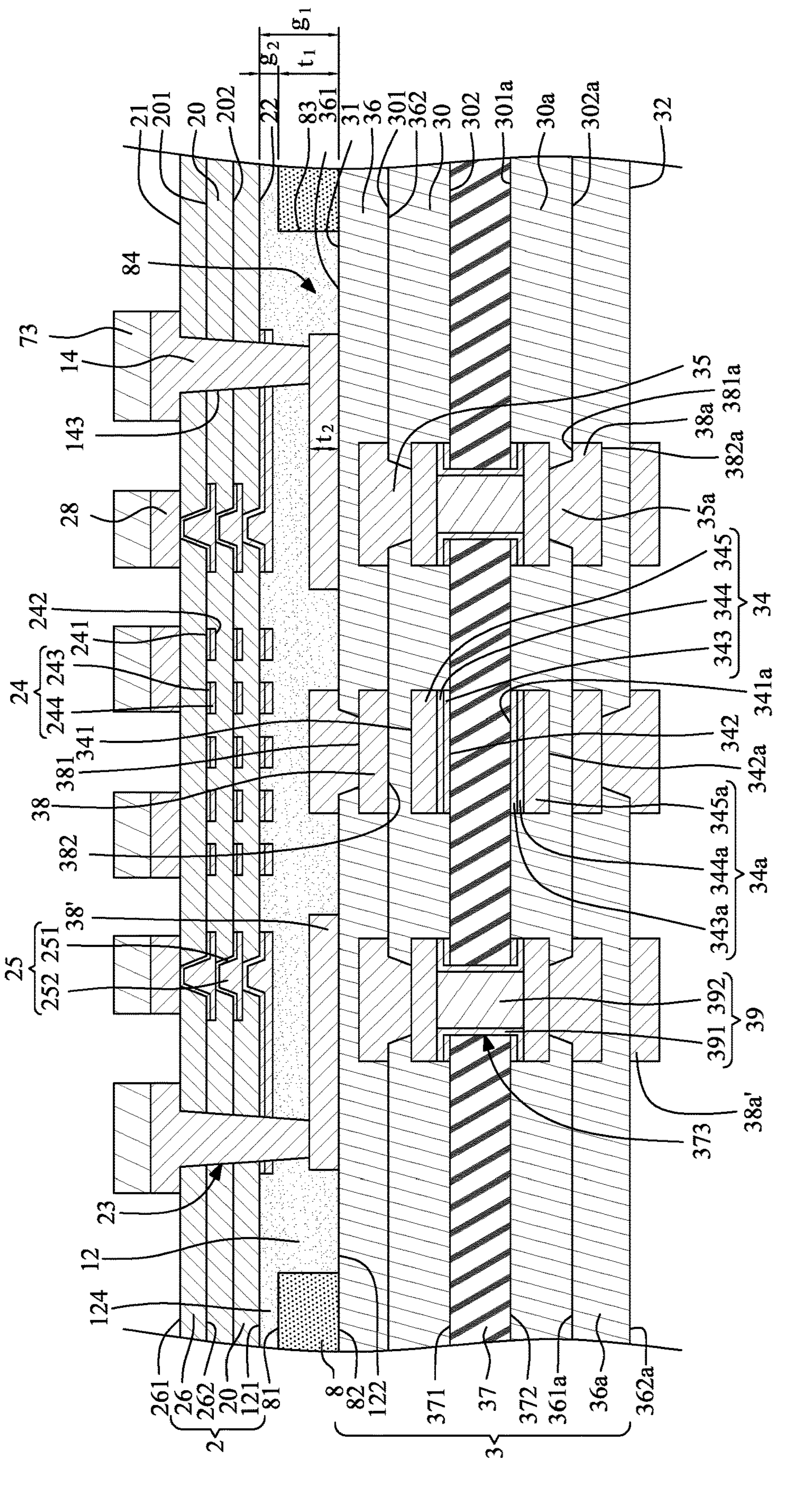
FIG. 33 illustrates one or more stages of an example of a method for manufacturing a wiring structure according to some embodiments of the present disclosure.

Referring to FIG. 33, portions of the metallic layer 72 that are not covered by the top photoresist layer 73 are removed by an etching technique or other suitable techniques. Portions of the metallic layer 72 that are covered by the top photoresist layer 73 remain to form a second circuit layer 28. Then, the top photoresist layer 73 is removed by a stripping technique or other suitable techniques. Then, a singulation process is conducted so as to obtain the wiring structure 1 of FIG. 1.

Spatial descriptions, such as "above," "below," "up," "left," "right," "down," "top," "bottom," "vertical," "horizontal," "side," "higher," "lower," "upper," "over," "under," and so forth, are indicated with respect to the orientation shown in the figures unless otherwise specified. It should be understood that the spatial descriptions used herein are for purposes of illustration only, and that practical implementations of the structures described herein can be spatially arranged in any orientation or manner, provided that the merits of embodiments of this disclosure are not deviated from by such an arrangement.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, two numerical values can be deemed to be "substantially" the same or equal if a difference between the values is less than or equal to ±10% of an average of the values, such as less than or equal to ±5%, less than or equal to ±4%, less than or equal to ±3%, less than or equal to ±±2%, less than or equal to ±1%, less than or equal to ±0.5%, less than or equal to ±0.1%, or less than or equal to ±0.05%.

Two surfaces can be deemed to be coplanar or substantially coplanar if a displacement between the two surfaces is no greater than 5 μm, no greater than 2 μm, no greater than 1 μm, or no greater than 0.5 μm.

As used herein, the singular terms "a," "an," and "the" may include plural referents unless the context clearly dictates otherwise.

As used herein, the terms "conductive," "electrically conductive" and "electrical conductivity" refer to an ability to transport an electric current. Electrically conductive materials typically indicate those materials that exhibit little or no opposition to the flow of an electric current. One measure of electrical conductivity is Siemens per meter (S/m). Typically, an electrically conductive material is one having a conductivity greater than approximately $10^4$ S/m, such as at least $10^5$ S/m or at least $10^6$ S/m. The electrical conductivity of a material can sometimes vary with temperature. Unless otherwise specified, the electrical conductivity of a material is measured at room temperature.

Additionally, amounts, ratios, and other numerical values are sometimes presented herein in a range format. It is to be understood that such range format is used for convenience and brevity and should be understood flexibly to include numerical values explicitly specified as limits of a range, but also to include all individual numerical values or sub-ranges encompassed within that range as if each numerical value and sub-range is explicitly specified.

While the present disclosure has been described and illustrated with reference to specific embodiments thereof, these descriptions and illustrations are not limiting. It should be understood by those skilled in the art that various changes may be made and equivalents may be substituted without departing from the true spirit and scope of the present disclosure as defined by the appended claims. The illustrations may not be necessarily drawn to scale. There may be distinctions between the artistic renditions in the present disclosure and the actual apparatus due to manufacturing processes and tolerances. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations of the present disclosure.

What is claimed is:

1. A wiring structure, comprising:

a first conductive structure including at least one dielectric layer and at least one circuit layer in contact with the dielectric layer;

a second conductive structure including at least one dielectric layer and at least one circuit layer in contact with the dielectric layer;

a dent structure attached to the first conductive structure; and an adhesion layer interposed between the first conductive structure and the second conductive structure to bond the first conductive structure and the second conductive structure together, wherein a periphery portion of the adhesion layer is disposed in a gap between the dent structure and the second conductive structure.

2. The wiring structure of claim 1, wherein a line space of the circuit layer of the first conductive structure is greater than a line space of the circuit layer of the second conductive structure.

3. The wiring structure of claim 1, wherein a line space of the circuit layer of the second conductive structure is greater than a line space of the circuit layer of the first conductive structure.

4. The wiring structure of claim 1, wherein the dent structure is an enclosed loop from a top view.

5. The wiring structure of claim 1, wherein a thickness of the dent structure is less than a gap between the first conductive structure and the second conductive structure.

6. The wiring structure of claim 1, wherein a topmost circuit layer of the first conductive structure protrudes from a top surface of the first conductive structure, and a thickness of the dent structure is greater than or equal to a thickness of the topmost circuit layer of the first conductive structure.

7. The wiring structure of claim 6, wherein the dent structure contacts the top surface of the first conductive structure directly.

8. The wiring structure of claim 1, further comprising at least one conductive via extending through at least a portion of the second conductive structure and the adhesion layer, and electrically connected to the circuit layer of the first conductive structure.

9. The wiring structure of claim 1, further comprising at least one conductive via extending through at least a portion of the first conductive structure and the adhesion layer, and electrically connected to the circuit layer of the second conductive structure.

10. The wiring structure of claim 1, wherein a material of the dent structure is different from a material of the dielectric layer of the first conductive structure.

11. The wiring structure of claim 1, wherein the dent structure defines a central cavity, and the second conductive structure is attached to a central portion of the adhesion layer in the central cavity of the dent structure.

12. The wiring structure of claim 1, wherein a width of the second conductive structure is less than a width of the first conductive structure.

13. A wiring structure, comprising:

a first stacked structure including at least one dielectric layer and at least one circuit layer in contact with the dielectric layer;

a second stacked structure including at least one dielectric layer and at least one circuit layer in contact with the dielectric layer, wherein a width of the second stacked structure is less than a width of the first stacked structure;

a dent structure attached to the first stacked structure, and defining a central cavity; and an adhesion layer disposed in the central cavity, and the second conductive structure is attached to the adhesion layer in the central cavity of the dent structure.

14. The wiring structure of claim 13, wherein a line space of the circuit layer of the first stacked structure is greater than a line space of the circuit layer of the second stacked structure.

15. The wiring structure of claim 13, wherein a periphery portion of the adhesion layer is disposed in a gap between the dent structure and the second stacked structure.

16. The wiring structure of claim 13, wherein the first stacked structure further includes a core portion, and the at least one dielectric layer and the at least one circuit layer of the first stacked structure are disposed adjacent to a surface of the core portion.

17. The wiring structure of claim 13, further comprising at least one conductive via extending through the first stacked structure, the second stacked structure or the wiring structure, and electrically connecting the first stacked structure and the second stacked structure.

18. A method for manufacturing a wiring structure, comprising:

(a) providing a first conductive structure including at least one dielectric layer and at least one circuit layer in contact with the dielectric layer;

(b) forming a dent structure on the first conductive structure to define a central cavity;

(c) disposing an adhesion layer in the central cavity;

(d) providing a second conductive structure including at least one dielectric layer and at least one circuit layer in contact with the dielectric layer; and (e) attaching the second conductive structure to the first conductive structure through the adhesion layer.

19. The method of claim 18, wherein after (e), the method further comprises:

(f) electrically connecting the first conductive structure and the second conductive structure.

20. The method of claim 19, wherein (f) is forming at least one conductive via extending through the first conductive structure and/or the second conductive structure, wherein the first conductive structure is electrically connected to the second conductive structure through the conductive via.

* * * * *